United States Patent
Hirano

(10) Patent No.: US 11,260,577 B2
(45) Date of Patent: Mar. 1, 2022

(54) IMPRINT APPARATUS, PLANARIZED LAYER FORMING APPARATUS, FORMING APPARATUS, CONTROL METHOD, AND METHOD OF MANUFACTURING ARTICLE

(71) Applicant: CANON KABUSHIKI KAISHA, Tokyo (JP)

(72) Inventor: Shinichi Hirano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/274,606

(22) Filed: Feb. 13, 2019

(65) Prior Publication Data

US 2019/0255760 A1 Aug. 22, 2019

(30) Foreign Application Priority Data

Feb. 19, 2018 (JP) .............................. JP2018-027251
Jan. 17, 2019 (JP) .............................. JP2019-006213

(51) Int. Cl.
*B29C 59/02* (2006.01)
*B29C 43/34* (2006.01)
*B29C 59/00* (2006.01)
*B29C 43/58* (2006.01)

(52) U.S. Cl.
CPC .............. *B29C 59/02* (2013.01); *B29C 43/34* (2013.01); *B29C 43/58* (2013.01); *B29C 59/002* (2013.01)

(58) Field of Classification Search
CPC ......... B29C 59/02; B29C 43/34; B29C 43/58; B29C 59/002
See application file for complete search history.

(56) References Cited

FOREIGN PATENT DOCUMENTS

| JP | 2007296783 A | * | 11/2007 |
| JP | 2007296783 A | | 11/2007 |
| JP | 2010258085 A | | 11/2010 |
| JP | 2011238788 A | | 11/2011 |

* cited by examiner

*Primary Examiner* — Yung-Sheng M Tsui
(74) *Attorney, Agent, or Firm* — Rossi, Kimms & McDowell LLP

(57) ABSTRACT

An imprint apparatus for bringing a mold and an imprint material on a substrate into contact with each other and performing imprint processing for forming a pattern of the imprint material is provided. The apparatus comprises a supplier configured to supply the imprint material on the substrate in accordance with a supply pattern of the imprint material, and a controller configured to control the supplier, wherein the controller obtains a contact timing as a timing at which the mold and the imprint material are brought into contact with each other at each of a plurality of positions of the mold, and determines the supply pattern based on the obtained contact timing.

13 Claims, 18 Drawing Sheets

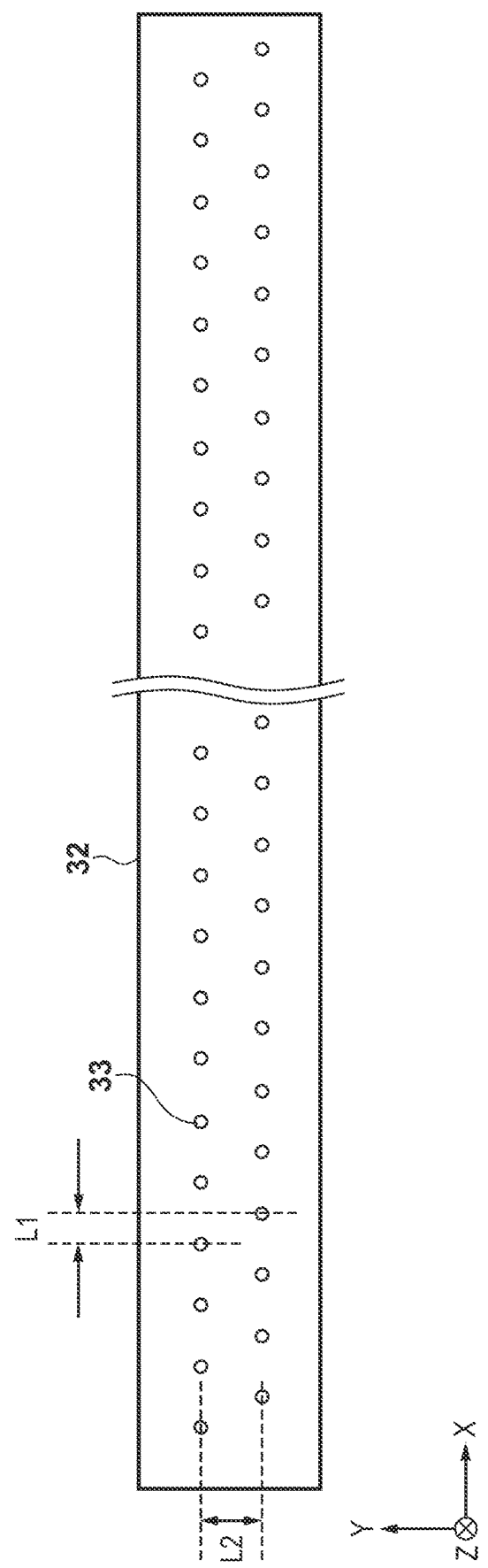

F I G. 15A
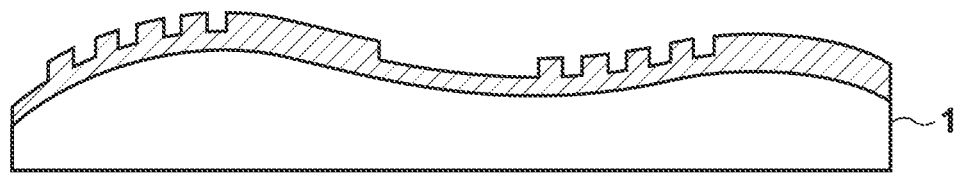
F I G. 15B
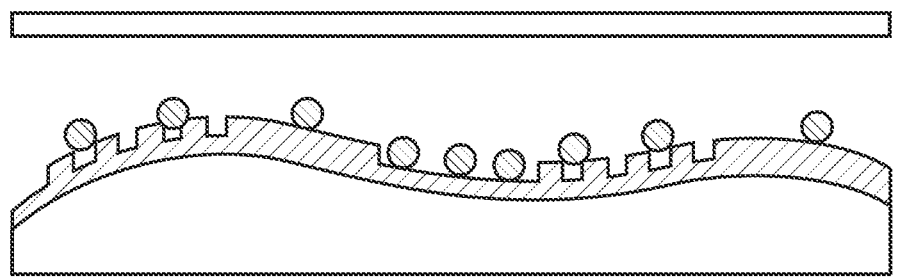
F I G. 15C
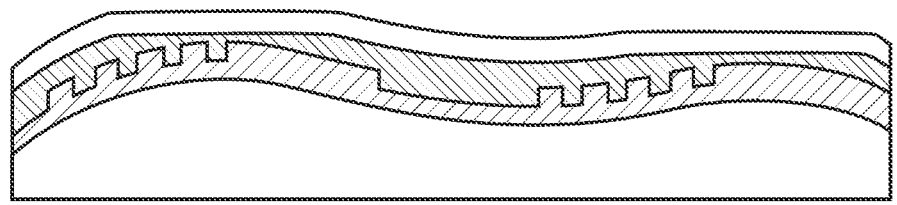
F I G. 15D
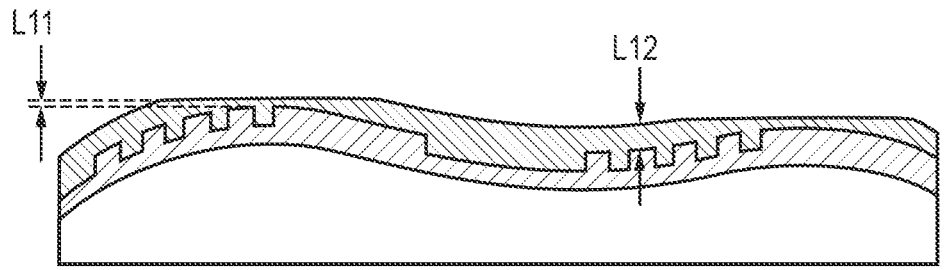

IMPRINT APPARATUS, PLANARIZED LAYER FORMING APPARATUS, FORMING APPARATUS, CONTROL METHOD, AND METHOD OF MANUFACTURING ARTICLE

BACKGROUND OF THE INVENTION

Field of the Invention

The present invention relates to an imprint apparatus, a planarized layer forming apparatus, a forming apparatus, a control method, and a method of manufacturing an article.

Description of the Related Art

Imprint apparatus is being put into practice as one of forming apparatuses (particularly lithography apparatuses) for manufacturing an article such as a magnetic storage medium or a semiconductor device. The imprint apparatus brings a mold on which a pattern is formed into contact with an imprint material on a substrate and cures the imprint material in a state in which the mold contacts the imprint material. After that, the mold is separated from the cured imprint material, thereby forming an imprint material pattern on the substrate.

A device manufacturing process includes a step of etching a substrate on which a pattern is formed. At this time, if the residual layer thickness of the pattern formed on the substrate is not uniform on the entire surface of the substrate, the shape (for example, a line width) of the pattern obtained by removing the residual layer can be nonuniform. For this reason, various kinds of techniques for making residual layer thickness uniform have been proposed.

Japanese Patent Laid-Open No. 2007-296783 describes a method of calculating the distribution (gap distance distribution) of a distance between a substrate and a mold when the mold is brought into contact with an imprint material on a shot region of the substrate and determining a coating amount distribution of the imprint material so that the distance between the mold and the imprint material becomes uniform. Especially, Japanese Patent Laid-Open No. 2007-296783 describes a technique of increasing a supply amount of the imprint material for a portion where the gap distance is large in order to uniform the distance between the mold and the imprint material.

In recent years, multi-area imprint processing for collectively imprinting a plurality of shot regions has been developed. When collectively imprinting the plurality of shot regions, since the contact area between the mold and the substrate is increased, not only the concave/convex portion of the underlayer pattern on the substrate but also the concave/convex portion of the substrate itself cannot be ignored. According to an examination, in a region having an earlier timing at which the substrate is brought into contact with the mold, the imprint material flows to the peripheral portion, and the residual layer thickness becomes small. In a region having a more delayed timing at which the substrate is brought into contact with the mold, the imprint material flows from the peripheral region, and the residual layer thickness becomes large. For this reason, the residual layer thickness can become nonuniform when collectively imprinting the plurality of shot regions.

SUMMARY OF THE INVENTION

The present invention provides an imprint apparatus advantageous in uniformity of a residual layer thickness.

The present invention in its one aspect provides an imprint apparatus for bringing a mold and an imprint material on a substrate into contact with each other and performing imprint processing for forming a pattern of the imprint material, comprising a supplier configured to supply the imprint material on the substrate in accordance with a supply pattern of the imprint material, and a controller configured to control the supplier, wherein the controller obtains a contact timing as a timing at which the mold and the imprint material are brought into contact with each other at each of a plurality of positions of the mold, and determines the supply pattern based on the obtained contact timing.

Further features of the present invention will become apparent from the following description of exemplary embodiments with reference to the attached drawings.

BRIEF DESCRIPTION OF THE DRAWINGS

FIG. 3 is a view showing an arrangement example of a discharge head and discharge ports of an imprint material supplier;

FIGS. 15A to 15D are views for explaining processing by a conventional planarized layer forming apparatus;

DESCRIPTION OF THE EMBODIMENTS

Figure 1:
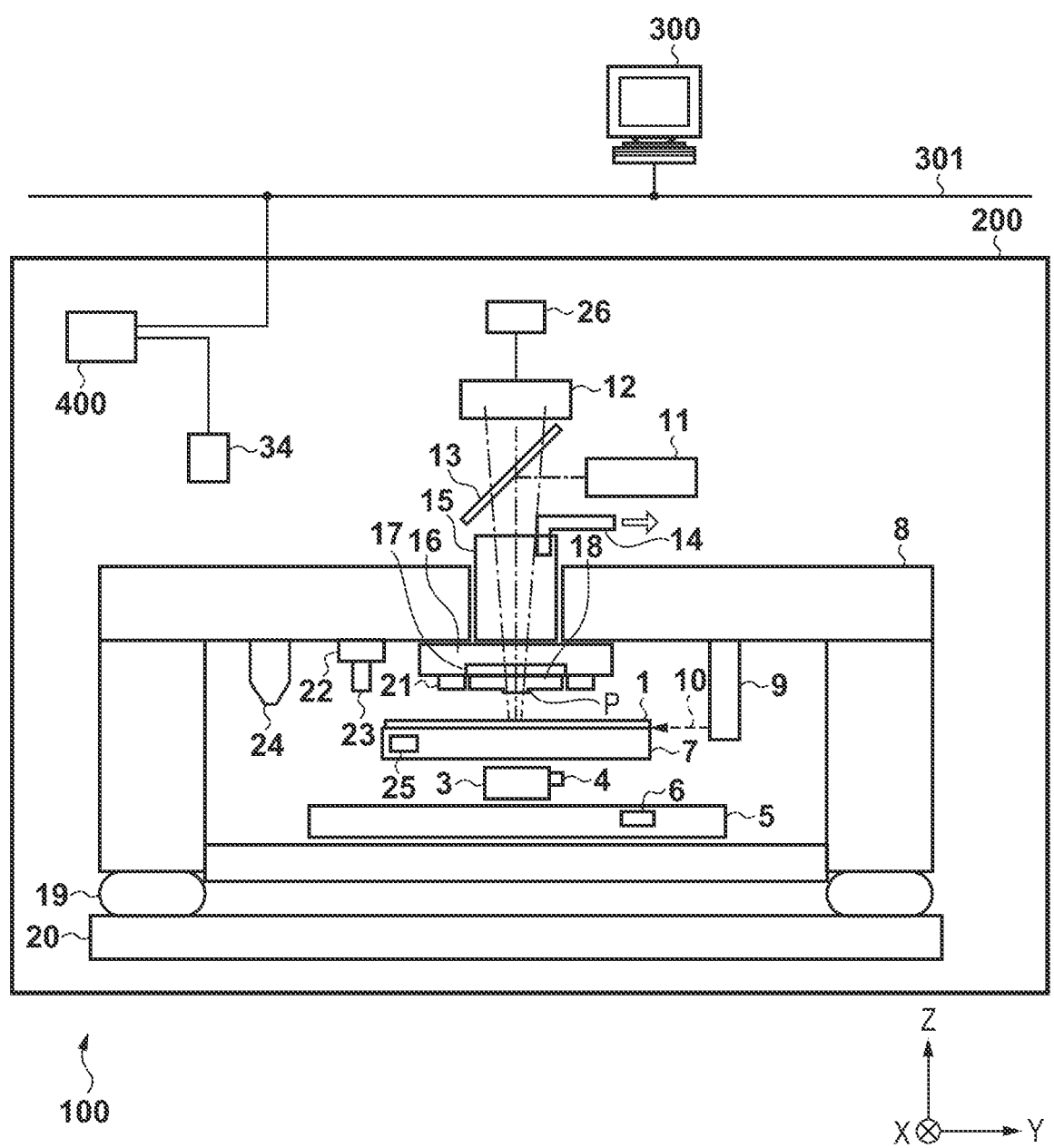
FIG. 1 is a view showing the schematic arrangement of an imprint apparatus according to an embodiment.

Various exemplary embodiments, features, and aspects of the invention will be described in detail below with reference to the drawings.

Embodiments of the present invention will be described in detail with reference to the accompanying drawings. Note that the following embodiments are merely detailed practical examples of the present invention, and the present invention is not limited to the following embodiments. All combinations of the features to be described in the embodiments are not essential for solving the problem of the present invention.

A forming apparatus is an apparatus for forming a cured product of a curable composition on a substrate by using a mold. As an example, the forming apparatus is implemented as an imprint apparatus for transferring a mold pattern onto a curable composition (imprint material) on the substrate by using the mold having a pattern. This imprint apparatus is shown as the first embodiment. In addition, the forming apparatus is also implemented as a planarized layer forming apparatus for forming a planarized layer of the curable composition on the substrate by using a mold having no pattern (that is, a flat mold). This planarized layer forming apparatus is shown as the second embodiment.

First Embodiment

The outline of an imprint apparatus according to this embodiment will now be described. The imprint apparatus is an apparatus for bringing an imprint material supplied onto a substrate into contact with a mold, applying curing energy to the imprint material, and forming a pattern of the cured product to which a concave/convex pattern of the mold is transferred.

As an imprint material, a curable composition (to be also referred to a resin in an uncured state) to be cured by receiving the curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photo-curable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film obtained by connecting a plurality of droplets supplied by the imprint material supplier. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

FIG. 1 is a schematic view showing the arrangement of an imprint apparatus 100 according to this embodiment. The imprint apparatus 100 performs imprint processing for bringing the imprint material on the substrate into contact with the mold and forming the pattern of the imprint material. The imprint processing by the imprint apparatus 100 includes processing for supplying the imprint material onto the surface of a substrate 1, curing the imprint material in a state in which a mold 18 is in contact with this imprint material. In this embodiment, the imprint apparatus 100 employs a photo-curing method for curing the imprint material with irradiation of ultraviolet light (UV light) as the imprint material curing method. Accordingly, the imprint apparatus 100 irradiates the imprint material with ultraviolet light in a state in which the imprint material on the substrate 1 and the mold 18 (the pattern surface of the mold) contact each other to cure the imprint material, thereby forming the pattern of the imprint material on the substrate 1. Note that the imprint apparatus 100 may cure the imprint material upon light irradiation in the other wavelength range or may employ a heat curing method for curing the imprint material with another energy such as heat. In the following description, directions perpendicular to each other within a plane along the surface of the substrate to which the imprint material is supplied are defined as X- and Y-axes, and a direction perpendicular to the X- and Y-axes (for example, a direction parallel to the optical axis of the ultraviolet light incident on the imprint material) is defined as a Z-axis.

The imprint apparatus 100 includes a chamber 200 for maintaining the imprint environment at a predetermined temperature and a predetermined humidity and preventing entry of foreign materials. The imprint apparatus 100 also includes a measurement device 4, a measurement device 6, a substrate stage 7, a bridge structure 8, a measurement device 9, a curing light source 11, an alignment measurement device 12, a half mirror 13, an exhaust duct 14, connecting member 15, and a mold head 16. The imprint apparatus 100 further includes an air spring 19, a base 20, a gas supplier 21, a holder 22, an imprint material supplier 23, an off-axis scope 24, a pressure sensor 25, a detector 26, a controller 400, and a user interface 34. The controller 400 is connected to a supervising computer 300 via a network 301.

The mold head 16 includes a mold chuck 17 for holding the mold 18. A concave/convex pattern corresponding to the pattern to be formed on the substrate 1 is formed in a pattern region P of the mold 18.

The detector 26 allows the user to observe, as image information, a contact state between the imprint material on the substrate and the mold 18, the filling state of the imprint material on the substrate to the mold 18, and the separation state of the mold 18 from the imprint material on the substrate. In addition, by moving the substrate stage 7, the positional relationship between the peripheral portion of the substrate and the substrate chuck can be observed.

The mold chuck 17 holds the mold 18 by, for example, vacuum suction. The mold chuck 17 has a structure for preventing drop of the mold 18 from the mold chuck 17. According to this embodiment, the mold chuck 17 is firmly coupled to the mold head 16. The mold head 16 includes a mechanism for allowing the mold head 16 to move in three axis directions, that is, at least the Z-axis direction, a ωX direction as the rotation direction around the X-axis, and a ωY direction as the rotation direction around the Y-axis with reference to the bridge structure 8. The mold head 16 is coupled to the bridge structure 8 via the connecting member 15 and supported by the bridge structure 8. In addition, the alignment measurement device 12 is also supported by the bridge structure 8.

The alignment measurement device 12 performs alignment measurement for aligning the mold 18 and the substrate 1. According to this embodiment, the alignment measurement device 12 includes an alignment detection system for detecting a mark on the mold 18 and a mark formed on the substrate stage 7 or the substrate 1 and generating an alignment signal. The alignment measurement device 12 may include a camera and may have a function of observing a curing state (imprint state) of the imprint material on the substrate 1 upon irradiation of the ultraviolet light as in the detector 26. In this case, in addition to the curing state of the imprint material, the alignment measurement device 12 allows the user to observe the contact state between the imprint material and the mold 18, the filling state of the imprint material to the mold 18, and the separation state of the mold 18 from the imprint material. The half mirror 13 is arranged above the connecting member 15. Light from the curing light source 11 is reflected by the half mirror 13 and passes through the mold 18, and the imprint material on the substrate 1 is irradiated with this light. The imprint material on the substrate 1 is cured with light irradiation from the curing light source 11.

The bridge structure 8 is supported by the base 20 via the air spring 19 for insulating the vibration from a floor. The air spring 19 has a structure generally employed as a lithography apparatus serving as an active anti-vibration function. For example, the air spring 19 includes an XYZ relative position measurement device sensor, an XYZ driving linear motor, a servo valve for controlling the internal air capacity of the air spring, and the like arranged in each of the bridge structure 8 and the base 20. The imprint material supplier 23 (dispenser) is attached to the bridge structure 8 via the holder 22. The imprint material supplier 23 can include a nozzle for supplying (coating) the imprint material to the substrate 1 and a supply controller for controlling the supply timing and supply amount of the imprint material. The imprint material supplier 23 supplies, for example, the droplets of the imprint material in a linear form to the substrate 1. By moving the substrate stage 7 (that is, the substrate 1) while supplying the imprint material from the imprint material supplier 23 to the substrate 1, a region having an arbitrary shape such as a rectangular shape on the substrate 1 can be coated with the imprint material.

The substrate 1 has a circular shape in this embodiment. A plurality of chips can be formed in one shot region having a size of 33 mm×26 mm.

In a process using the imprint apparatus 100, a layer is left in a concave portion of the concave/convex pattern formed on the upper surface of the substrate 1. This layer is called a residual layer. The residual layer must be removed by etching. The residual layer thickness is called an RLT (Residual Layer Thickness). If a layer having a thickness corresponding to the necessary RLT is not formed in a shot region, the substrate 1 is recessed by etching. According to this embodiment, by combining the discharge of the imprint material by the imprint material supplier 23 and the movement of the substrate stage 7, an appropriate region of the substrate 1 is coated with the imprint material.

The substrate stage 7 includes a substrate chuck, and the substrate chuck holds the substrate 1. The substrate stage 7 includes a mechanism for allowing the movement in six axis directions of X, Y, Z, ωX, ωY, and mZ. According to this embodiment, the substrate stage 7 is supported by the bridge structure 8 via an X slider 3 including an X-direction moving mechanism and a Y slider 5 including a Y-direction moving mechanism. The measurement device 4 for measuring the relative position between the X slider 3 and the Y slider 5 is arranged in the X slider 3. The measurement device 6 for measuring the relative position between the Y slider 5 and the bridge structure 8 is arranged in the Y slider 5. The measurement devices 4 and 6 measure the position of the substrate stage 7 with reference to the bridge structure 8. Each of the measurement devices 4 and 6 is formed from an encoder (linear encoder).

The Z-direction distance between the substrate stage 7 and the bridge structure 8 is determined by the bridge structure 8, the X slider 3, and the Y slider 5. By maintaining the rigidity of the Z direction and the tilt direction of each of the X slider 3 and the Y slider 5 as high as about ten nm/N, the variation of the Z-direction imprint operation between the substrate stage 7 and the bridge structure 8 can be suppressed to the variation of several tens of nm.

The measurement device 9 is arranged in the bridge structure 8 and is formed from an interferometer in this embodiment. The measurement device 9 emits measurement light 10 toward the substrate stage 7 and detects the measurement light 10 reflected by an interferometer mirror arranged at the end face of the substrate stage 7, thereby measuring the position of the substrate stage 7. The measurement device 9 measures the position of the substrate stage 7 at a position nearer than the measurement devices 4 and 6 with respect to the substrate 1 holding surface of the substrate stage 7. Note that in FIG. 1, although only one measurement light 10 emitted from the measurement device 9 to the substrate stage 7 is illustrated, the measurement device 9 is arranged so as to measure at least the XY positions, the rotation amount, and the tilt amount of the substrate stage 7.

In order to improve the filling property of the imprint material to the pattern of the mold 18, the gas supplier 21 supplies a filling gas to a portion near the mold 18, and more specifically a space between the mold 18 and the substrate 1. The filling gas includes at least one of permeable gas or condensable gas in order to quickly reduce the filling gas (bubbles) inserted between the mold 18 and the imprint material and accelerate filling of the imprint material to the pattern of the mold 18. In this case, the permeable gas is a gas which has high permeability with respect to the mold 18 and is permeated through the mold 18 when bringing the mold 18 into contact with the imprint material on the substrate 1. The condensable gas is a gas which is liquefied (that is, condensed) when bringing the mold 18 into contact with the imprint material on the substrate 1.

The off-axis scope 24 detects the reference mark and the alignment mark formed on the reference plate arranged on the substrate stage 7 without being through the mold 18. In addition, the off-axis scope 24 can also detect the alignment mark formed on the substrate 1 (each shot region of the substrate 1). The off-axis scope 24 can further measure the height of each region on the substrate. According to this embodiment, the pressure sensor 25 is arranged on the substrate stage 7 and detects a pressure acting on the substrate stage 7 by bringing the mold 18 into contact with the imprint material on the substrate 1. The pressure sensor 25 functions as a sensor for detecting the contact state between the mold 18 and the imprint material on the substrate 1 by detecting a pressure acting on the substrate stage 7. The pressure sensor 25 may be arranged on the mold head 16 and may be arranged on at least one of the mold head 16 and the substrate stage 7.

The controller 400 includes a CPU, a memory, and the like and controls the operation of the imprint apparatus 100. In this embodiment, the controller 400 controls imprint processing and processing associated with the imprint processing and generates a droplet array recipe including the supply pattern of the imprint material. Details of the controller 400 will be described in detail later.

Since the refractive index of the filling gas supplied from the gas supplier 21 is largely different from the refractive index of air, when the measurement devices 4 and 6 are exposed to the filling gas (that is, when the filling gas leaks to the measurement optical path of each of the measurement devices 4 and 6), the measurement values (measurement results) of the measurement devices 4 and 6 vary. This problem is conspicuous particularly for an interferometer having a long measurement optical path length. Since a high gain is obtained when controlling the position of the substrate stage 7, a servo error occurs. The influence of even an encoder having a short measurement optical path length cannot be ignored in an imprint apparatus in which the measurement accuracy on the order of nanometer is required. Note that since the measurement optical path length of the encoder is shorter than the measurement optical path length of the interferometer, the influence of the encoder is lighter than that of the interferometer. As shown in FIG. 1, according to this embodiment, a distance to each of the measurement devices 4 and 6 from the gas supplier 21 (the supply port of the filling gas of the supplier 21) can be sufficiently ensured, and each of the measurement devices 4 and 6 is formed from the encoder. Therefore, since each of the measurement devices 4 and 6 is arranged such that an influence of a variation in a measurement value by the filling gas is hardly affected, a servo error can hardly occur.

As described above, the gas supplier 21 supplies the filling gas to the space between the mold 18 and the substrate 1 while the imprint processing is being performed. The filling gas supplied between the mold 18 and the substrate 1 is sucked from the upper portion of the mold head 16 via the exhaust duct 14 and exhausted outside the imprint apparatus 100. In addition, the filling gas supplied between the mold 18 and the substrate 1 may not be discharged outside the imprint apparatus 100, but may be recovered by a gas recovery mechanism (not shown).

Figure 2A:
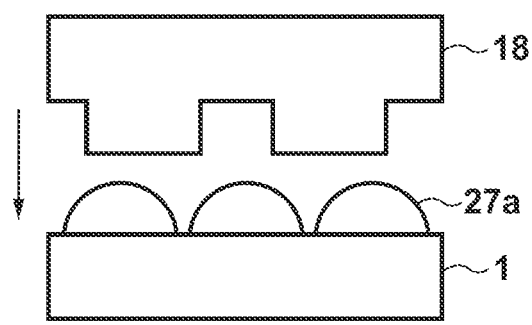
FIGS. 2A to 2D are views schematically showing imprint processing.
Figure 2B:
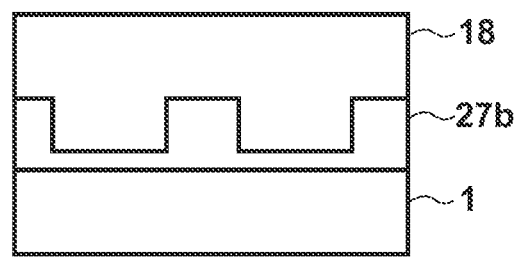
Figure 2C:
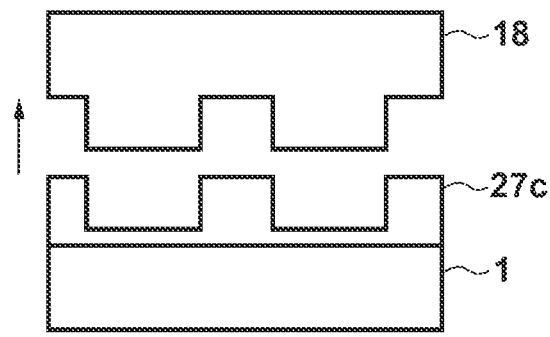
Figure 2D:
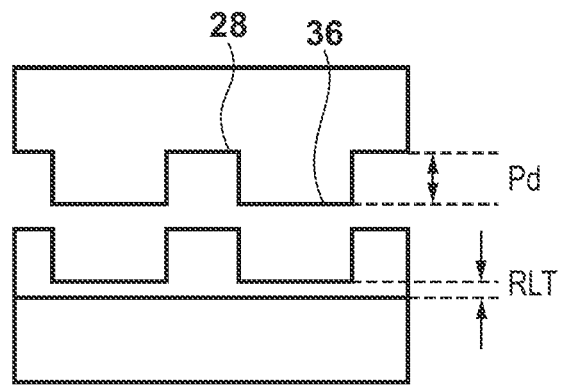

FIGS. 2A to 2D schematically show imprint processing. FIG. 2A shows a state before the pattern region P of the mold 18 contacts the shot region of the substrate 1 to which an imprint material 27a is supplied by the imprint material supplier 23. In this state, by moving the mold head 16 downward, the pattern region P of the mold 18 is brought into contact with the imprint material on the shot region of the substrate 1. FIG. 2B shows a state in which the pattern region P of the mold 18 contacts the imprint material on the shot region of the substrate 1. In this state, the imprint material on the shot region of the substrate 1 is irradiated with the light from the curing light source 11, thereby curing an imprint material 27b. FIG. 2C shows a state in which the mold 18 is released from the imprint material cured on the shot region of the substrate 1 by moving the mold head 16 upward. Accordingly, an imprint material pattern 27c corresponding to the pattern of the pattern region P of the mold 18 is left in the shot region of the substrate 1. FIG. 2D shows the pattern of the pattern region P of the mold 18 and the cured imprint material. The pattern of the mold 18 has a concave forming pattern 28 corresponding to the convex pattern to be formed on the substrate and a convex pattern 36 for the concave pattern to be formed on the substrate. In FIG. 2D, reference symbol Pd denotes a pattern depth; and RLT, a residual layer thickness.

FIG. 3 shows an arrangement example of a discharge head 32 and a plurality of discharge ports 33 of the imprint material supplier 23. When the arrangement interval between the plurality of discharge ports 33 is made narrow, the time required to fill the imprint material in the concave pattern of the mold 18 can be shortened. However, if the arrangement interval is too short, it is difficult to manufacture the discharge head 32, and the imprint material droplets discharged from the adjacent discharge ports can interfere with each other. If the plurality of imprint material droplets interfere with each other, these droplets are connected to each other to shift the position. The plurality of discharge ports 33 can be arrayed in a matrix form. In the example of FIG. 3, the plurality of discharge ports 33 are arrayed in two rows. In this case, the shift interval (center distance) of each column is set as L1, and the distance (center distance) between the rows is set as L2. L1 and L2 are used as the pieces of arrangement information of the plurality of discharge ports 33.

Figure 4:
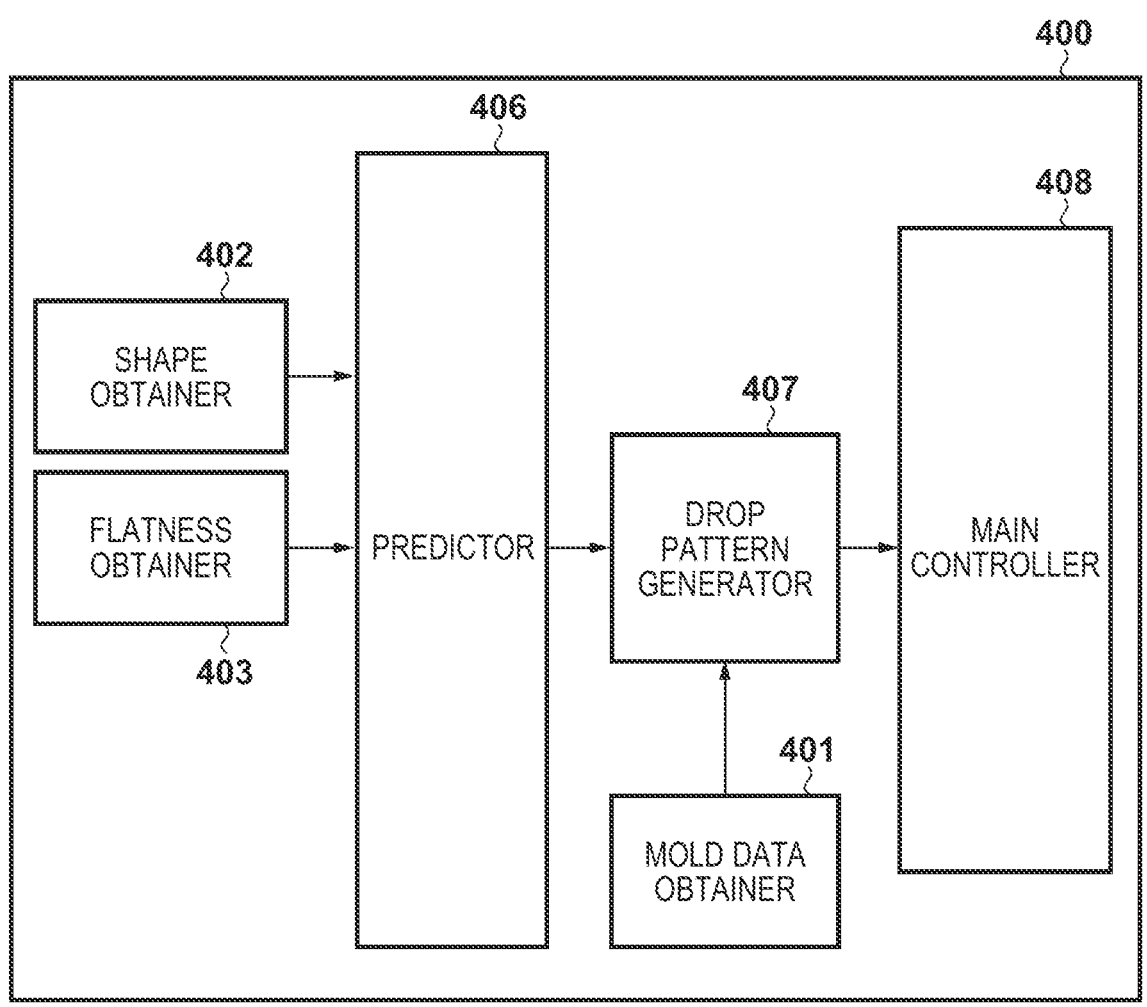
FIG. 4 is a block diagram showing the arrangement example of a controller of the imprint apparatus.
Figure 7:
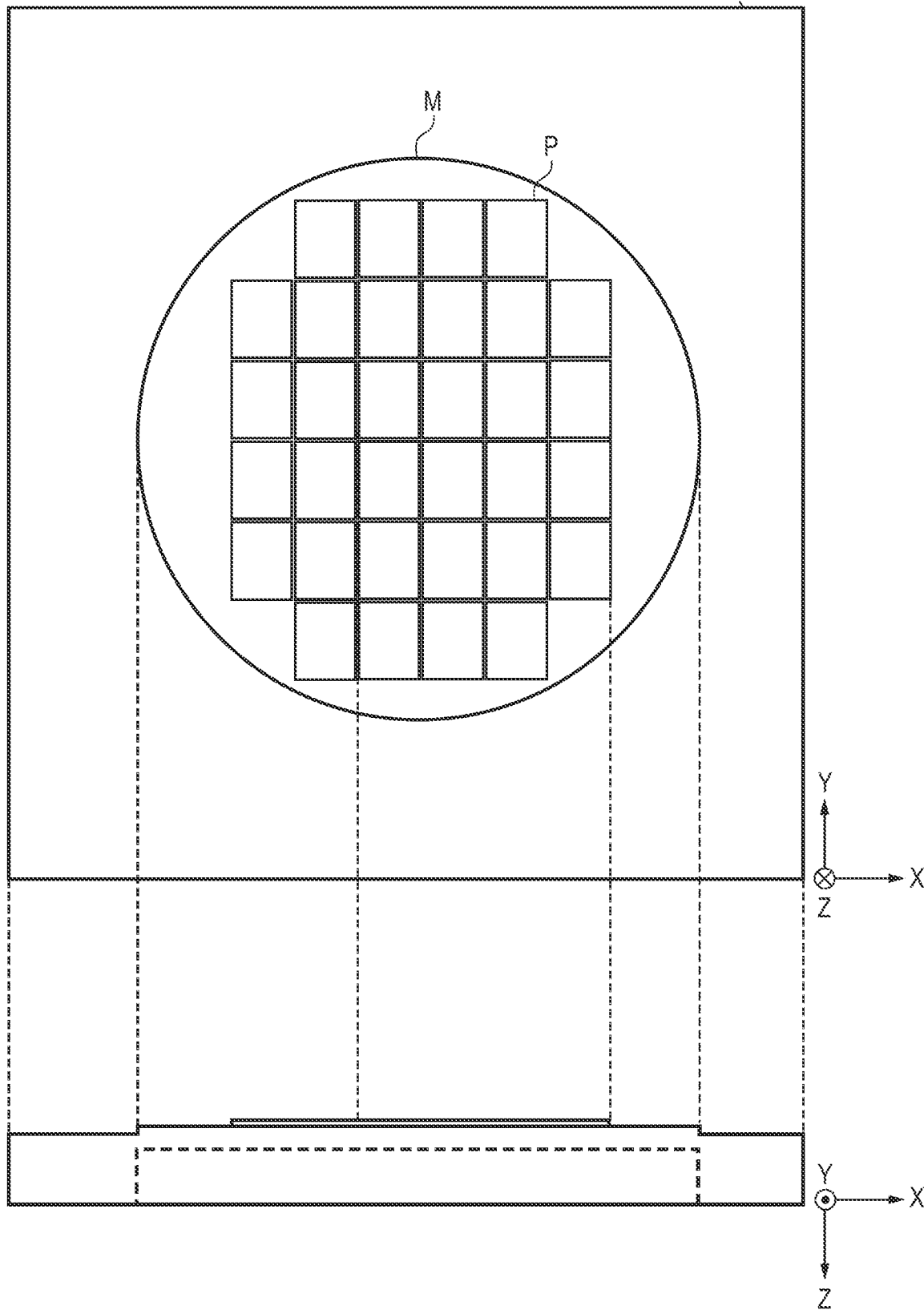
FIG. 7 is a view showing an example of a mold.

FIG. 4 is a block diagram showing the arrangement example of the controller 400. A mold data obtainer 401 obtains mold data including the densities of the mold patterns divided into small regions and their pattern directions. The mold data may include design information of the mold pattern or information converted from the design information. A shape obtainer 402 obtains shape information obtained when a mesa M in which the pattern of the mold 18 in FIG. 7 is formed is brought into contact with the imprint material. The mesa M is designed to be flat, but may be brought into the imprint material by deforming the held mold 18 upon applying a positive pressure from the above. The shape information represents a shape in this state. A flatness obtainer 403 obtains information (flatness information) of the flatness (wafer flatness) of the substrate. The flatness information can be information representing the height of each position on the substrate. This flatness information may be obtained from a measurement result from an external measurement apparatus. Alternatively, for example, the off-axis scope 24 may be functioned as a height measurement device, and flatness information may be obtained from a height measurement result of the entire surface of the substrate, or the flatness information may be information representing the designed flatness of the substrate. Note that if an underlayer is formed on a substrate, flatness information of the substrate can be flatness information of the underlayer formed on the substrate.

Based on the flatness information of the substrate, the controller 400 obtains a contact timing as a timing at which the mold and the imprint material are brought into contact with each other for each of a plurality of locations of the mold. For example, a predictor 406 predicts a timing at which the imprint material of each region of the pattern on the substrate and the mesa are brought into contact with each other, based on the shape information obtained from the shape obtainer 402 and the flatness information obtained from the flatness obtainer 403, thereby obtaining the contact timing. The drop pattern generator 407 generates an imprint material supply pattern (drop pattern) based on the timing information predicted by the predictor 406 and the mold data obtained from the mold data obtainer 401. The drop pattern generator 407 may generate the imprint material supply pattern based on the specified residual layer thickness and the dispenser type information in addition to the timing information calculated by the predictor 406 and the mold data obtained by the mold data obtainer 401. If the concave/convex amount obtained by the shape obtainer 402 is smaller to be negligible than the concave/convex amount obtained by the flatness obtainer 403, the predictor 406 may set the value of only flatness information obtained by the flatness obtainer 403 as the contact timing predicted value.

That is, the "contact timing obtaining" in this embodiment can include the form of directly obtaining the contact timing from the outside of the controller 400 and the form of obtaining substrate flatness information and the plate shape information and calculating the contact timing inside the controller to obtain the contact timing.

A main controller 408 controls all of the operations of the imprint apparatus 100 such as the conveyance of the substrate 1, the supply and alignment of the imprint material to the substrate 1, curing of the imprint material, and driving of the mold 18. In addition, the main controller 408 receives information necessary for the imprint processing via the user interface 34 or from the supervising computer 300 via the network 301 and transfers the information associated with the imprint processing.

Figure 5:
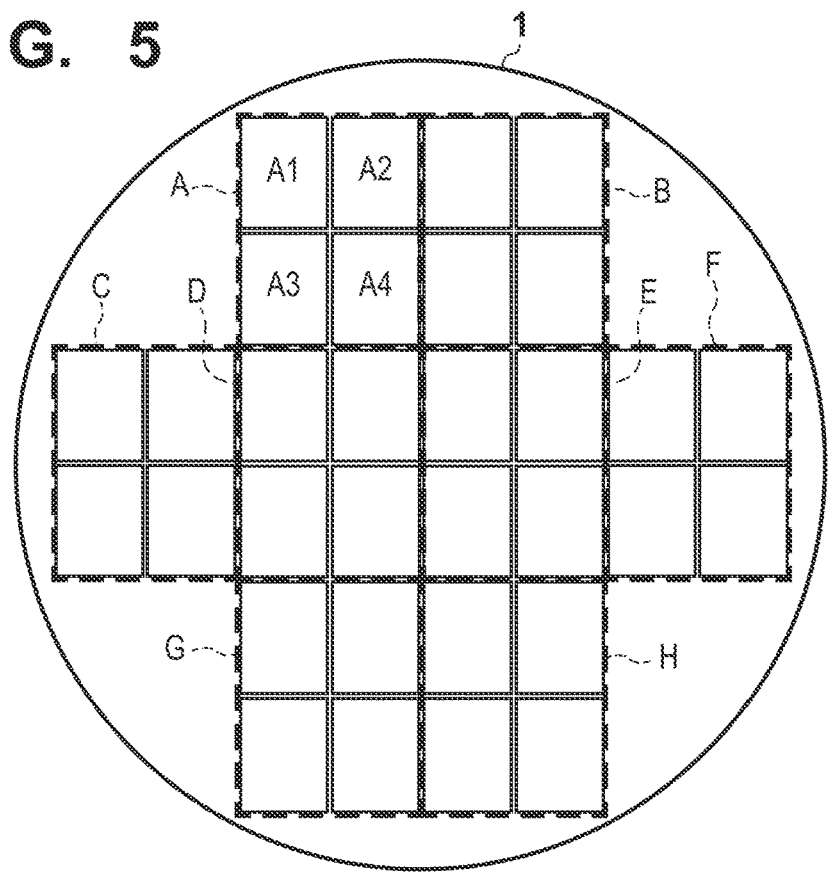
FIG. 5 is a view showing an example of a shot layout.
Figure 6:
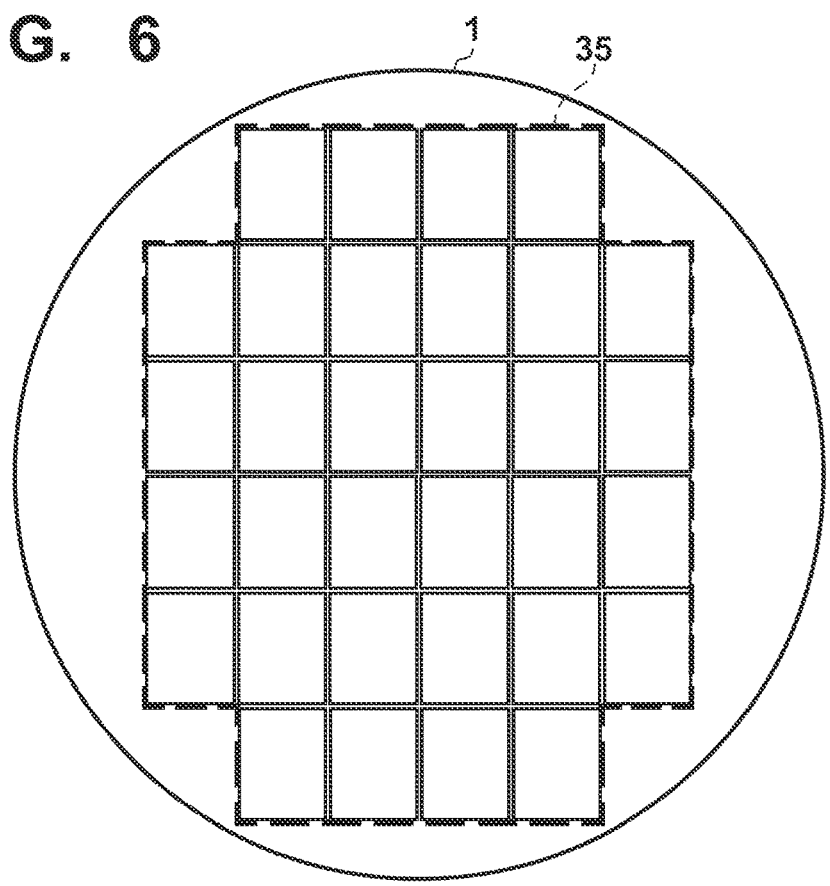
FIG. 6 is a view showing an example of a shot layout.

The imprint processing may be performed for each shot region of the substrate or collectively performed for a plurality of shot regions. FIG. 5 is a view showing a shot layout example of the substrate 1 when imprint processing is collectively performed for four shot regions. Referring to FIG. 5, regions to be collectively imprinted are indicated by a broken line. Patterns are formed by one imprint processing for each of regions A to H. The same patterns are formed in shot regions A1, A2, A3, and A4, respectively, included in the region A. This also applies to the regions B to H. FIG. 6 is a view showing a shot layout when the patterns are formed on the entire surface of the substrate 1 by one imprint processing. All shot regions 35 surrounded by a broken line are collectively imprinted in FIG. 6. FIG. 7 shows an example of the mold 18 used when the patterns are formed on the entire surface of the substrate by one imprint processing. This mold 18 includes the plurality of regions P corresponding to a mesa M and all the shot regions.

Figure 8A:
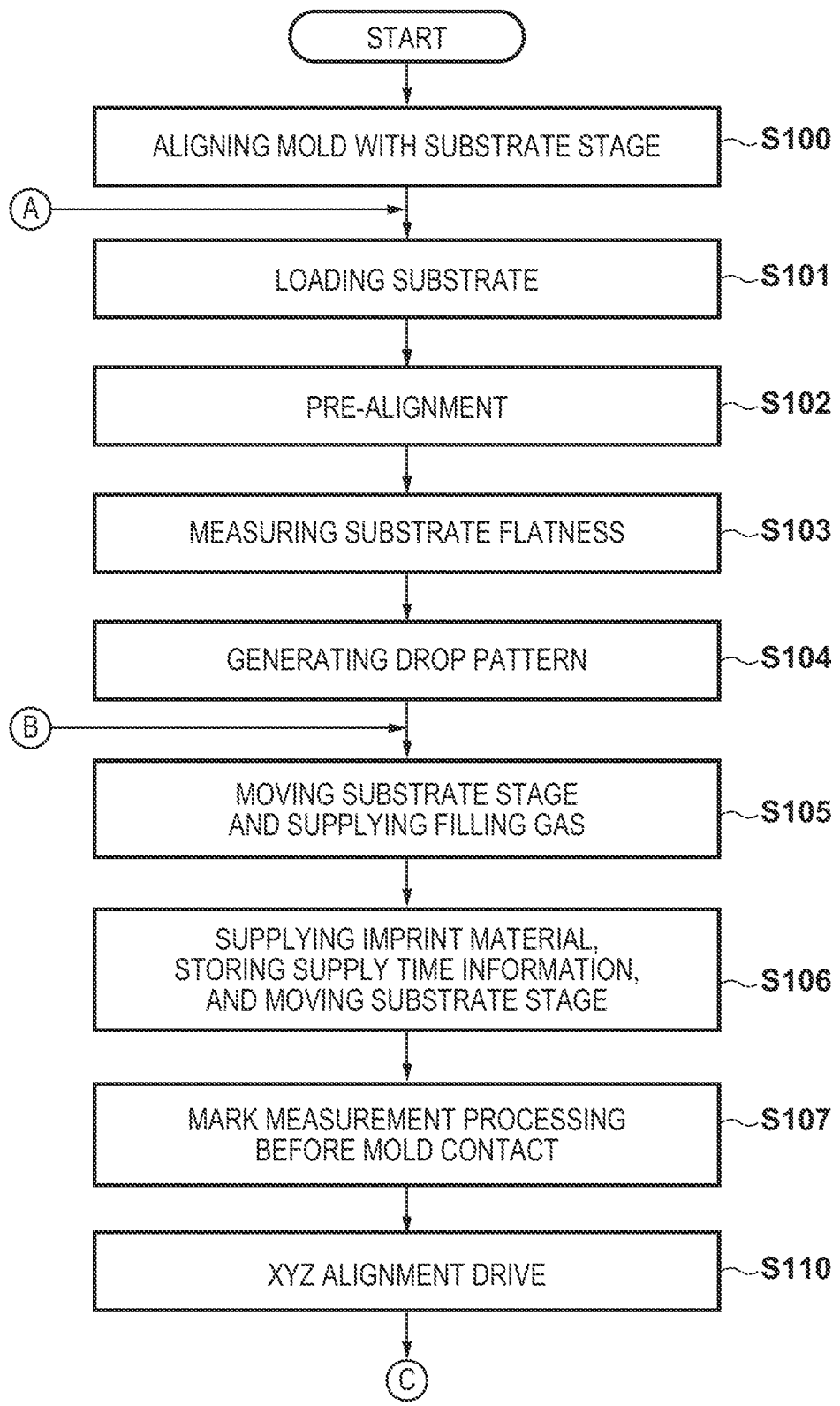
FIGS. 8A and 8B are flowcharts for explaining an operation of the imprint apparatus.
Figure 8B:
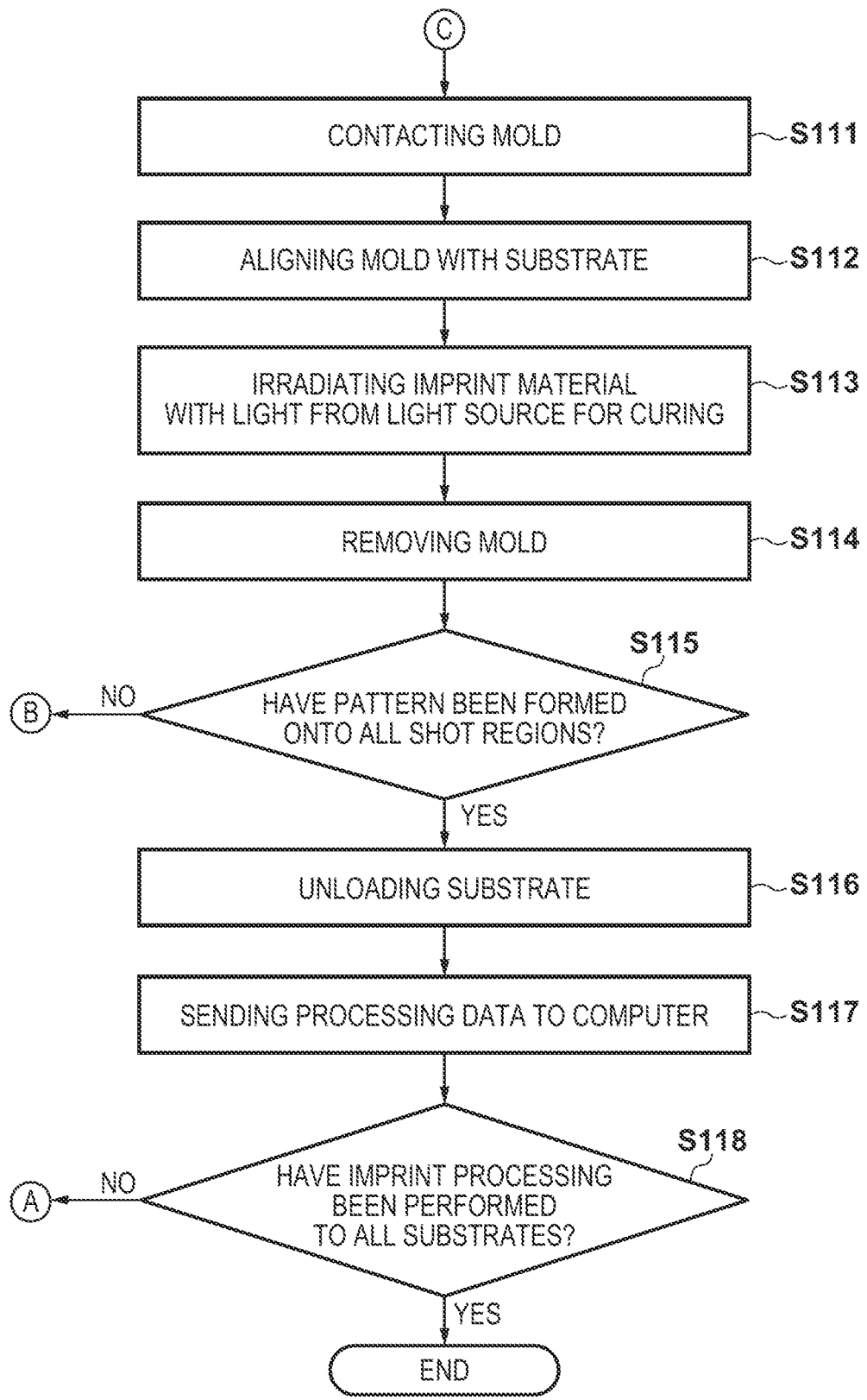

The operation of the imprint apparatus 100 will be described with reference to FIGS. 8A and 8B. This operation is controlled by the controller 400. In step S100, alignment between the mold 18 and the substrate stage 7 is performed based on the measurement result of the alignment measurement device 12. The mold 18 is loaded into the imprint apparatus 100 in advance by a mold conveying system (not shown) and is held in the mold chuck 17. The mark (alignment mark) detected by the alignment measurement device 12 may be formed on the substrate stage 7 as a dedicated reference mark or may be formed on a dedicated alignment substrate.

In step S101, the substrate 1 is loaded into the imprint apparatus 100, and the substrate 1 is held by the substrate stage 7 (the substrate chuck). In step S102, pre-alignment of the substrate 1 is performed. In the pre-alignment performed for the first time after loading the substrate 1 into the imprint apparatus 100, the substrate 1 is moved under the off-axis scope 24, and the off-axis scope 24 measures the position of the substrate 1. This pre-alignment is performed with accuracy such that the alignment mark formed in each shot region of the substrate 1 falls within the measurement range of the alignment measurement device 12 in the mark measurement processing (step S107) performed before the mold 18 is brought into contact with the imprint material on the substrate 1.

In step S103, the flatness obtainer 403 obtains information of flatness on the entire surface of the substrate 1. In this case, as described above, the off-axis scope 24 may measure the heights of the respective regions of the entire surface of the substrate 1 to generate flatness measurement data. In step S104, the drop pattern generator 407 generates a drop pattern using information of the contact timing between the mesa and the imprint material, which is predicted by the predictor 406 and the mold data (pattern density information and pattern direction information) obtained by the mold data obtainer 401.

Particularly, a mechanism for measuring the height of the surface of the substrate by detecting reflected light from the substrate by using a photoelectric conversion element can be employed as a mechanism for measuring the substrate height by the off-axis scope. More specifically, a method described in Japanese Patent Laid-Open No. 2011-238788 can be employed.

In addition, the off-axis position measurement apparatus (not shown) can measure the height distribution of the entire upper surface of the substrate with high accuracy. More specifically, the off-axis position measurement apparatus can include a measurement device for measuring the surface shape of the substrate and a memory unit for storing the measured surface shape and can measure the height of the upper surface of the substrate by causing the measurement device to measure a change amount of a surface position while moving a movable stage. More specifically, a method described in Japanese Patent Laid-Open No. 2010-258085 can be employed.

In step S105, the substrate stage 7 is moved so as to locate the imprint target shot region of the substrate 1 under the imprint material supplier 23. In addition, the gas supplier 21 supplies the filling gas to the space between the mold 18 and the substrate 1. In step S106, the imprint material supplier 23 supplies the imprint material to the shot region of the imprint target of the substrate 1. More specifically, in accordance with the arrangement information of the first drop recipe having the predetermined drop pattern information, the imprint material supplier 23 supplies the imprint material to the target shot region of the substrate 1 moved under the imprint material supplier 23. When the supply of the imprint material is completed, the number and time of the shot region to which the imprint material is supplied are stored in the memory. In addition, when the imprint material is supplied to the target shot region of the substrate 1, the substrate stage 7 is moved to the position where the shot region is located under the mold 18 (the pattern region P of the mold 18).

In step S107, alignment is performed by observing the mold-side mark and the substrate-side mark to ensure the overlay accuracy improvement and the imprint performance before the pattern region P of the mold 18 is brought into contact with the imprint material on the substrate 1. At this time, measurement for a gap distance serving as the difference between the mold 18 and the substrate 1 in the height direction is performed. Unless the contact driving is started in the correct positional relationship between the mold and the shot region on the substrate, adverse effects can occur such that the imprint material leaks outside the mold or a non-filling area of the imprint material is formed.

In step S110, XYZ alignment driving using the estimated value calculated from the alignment mark measurement result and the measurement result of adjacent shots is performed. In step S111, the mold head 16 is moved downward from the position moved in step S110 to bring the mold 18 into contact with the imprint material on the substrate 1. In step S112, alignment between the mold 18 and the substrate 1 (the shot region of the substrate 1) is performed based on the measurement result by the alignment measurement device 12 in a state in which the pattern surface P of the mold 18 is in contact with the imprint material on the substrate 1. This alignment is called die-by-dye alignment.

In step S113, the imprint material on the imprint target shot region of the substrate 1 is irradiated with the light from the curing light source 11 via the mold 18 in a state in which the pattern surface P of the mold 18 is in contact with the imprint material on the substrate 1. In step S114, the mold head 16 is moved upward to separate the mold 18 from the cured imprint material on the substrate 1. Accordingly, an imprint material pattern corresponding to the pattern surface P of the mold 18 is left in the shot region of the substrate 1. That is, the pattern corresponding to the pattern surface P of the mold 18 is formed in the shot region of the substrate 1. When removing the mold 18 from the cured imprint material, the mold head 16 is moved upward so that the shearing force acting on the pattern surface P of the mold 18 is equal to or less than the breaking stress of the imprint material pattern so as not to break the pattern of the imprint material.

The controller 400 determines in step S115 whether the patterns are formed on all the shot regions specified on the substrate 1. If the patterns are not formed on all the shot regions, the process advances to step S105 to form a pattern on the next shot region. If the patterns are formed on all the shot regions, the process advances to step S116. In step S116, the substrate 1 is unloaded from the imprint apparatus 100. In step S117, the controller 400 sends the processing data obtained by the imprint processing to the supervising computer 300 via the network 301. In step S118, the controller 400 determines whether the imprint processing is performed for all the substrates 1. Unless all the substrates have undergone the imprint processing, the process advances to step S103 to perform imprint processing for the next substrate 1. If all the substrates 1 have undergone the imprint processing, the processing ends.

Figure 9A:
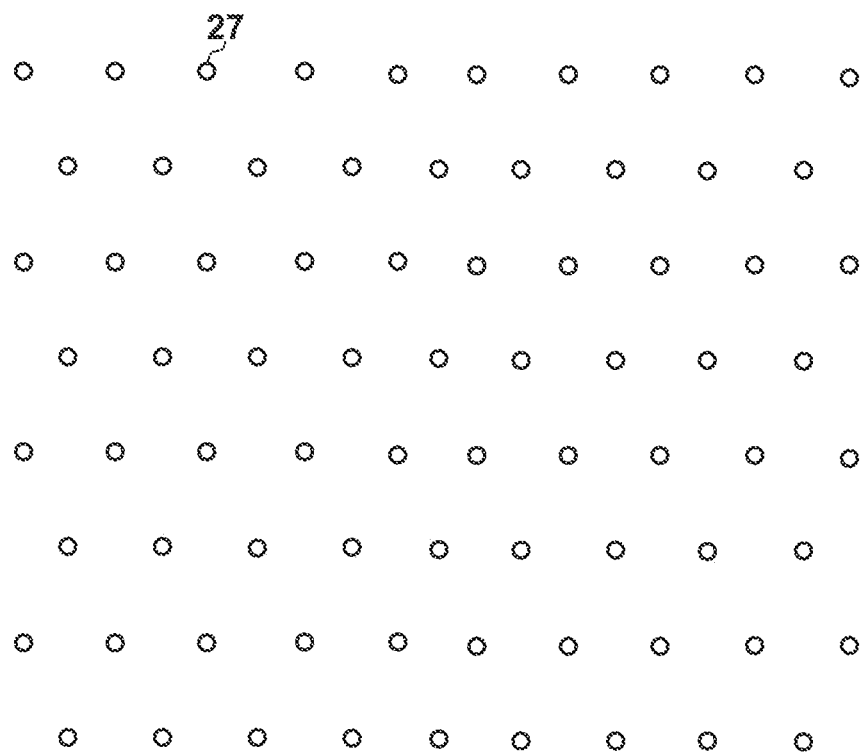
FIGS. 9A and 9B are views showing the layout examples of the imprint material.
Figure 9B:
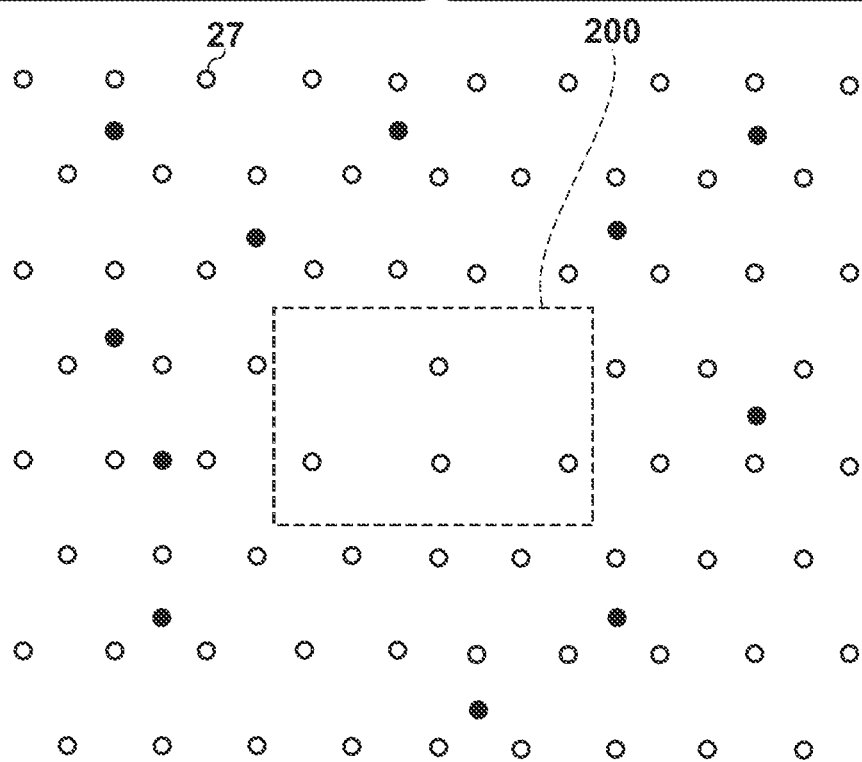

FIG. 9A is a view showing, in a planar manner, the supply (arrangement) of the imprint material 27 when the mold pattern is a uniform repetitive pattern and no concave/convex portions are present in the small region of the shot region of the substrate 1. In this case, the imprint material 27 has a uniformly repetitive supply pattern on the entire surface. FIG. 9B is a view showing, in a planar manner, the arrangement of the imprint material 27 when the concave/convex portion is present in the small region in the shot region. In the region except a small region 200, the substrate height tends to be lower than a concave/convex average height STMH (Shot Topography Mean Height). A larger amount of imprint material than the region having the height equal to the STMH must be arranged in this region. The small region 200 tends to have a substrate height larger than the STMH. A smaller amount of imprint material than the region having the height equal to the STMH must be arranged in this region. Note that at this time, the concave/convex portion of the small region is specified using the design data or height measurement data prepared under the assumption that the entire surface of the substrate is flat. The imprint material supply amount at this time is defined as a standard supply amount. In practice, since the concave/convex portion of the substrate itself cannot be ignored, and the standard supply amount is adjusted in consideration of the concave/convex portion.

If an amount of imprint material per droplet is kept unchanged, the method of adjusting the amount of imprint material in FIG. 9B is a method of adjusting the amount of imprint material of a specific region by a method of changing the number of droplets. A system capable of changing the amount of the imprint material per droplet can obtain the same effect by changing the amount of imprint material per droplet depending on the region using the same supply pattern.

Figure 10:
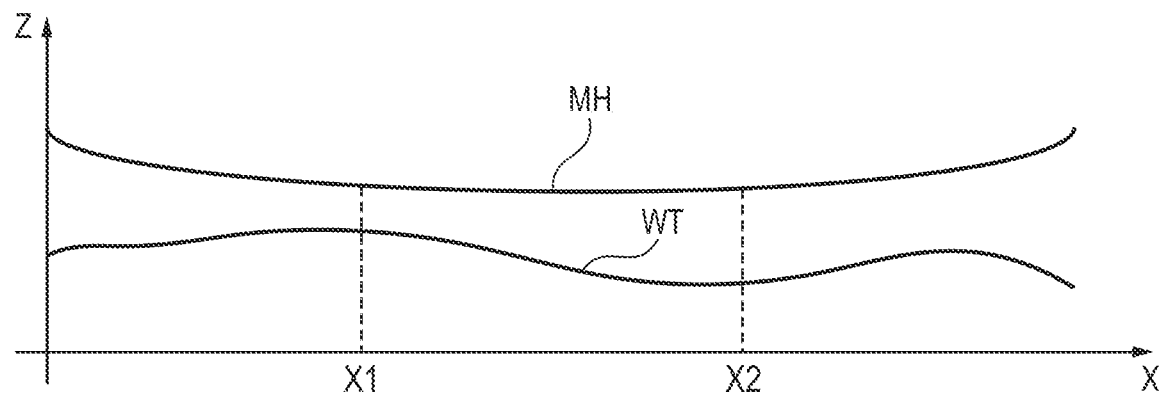
FIG. 10 is a view for explaining a distribution of a mold and a substrate in a height direction.

FIG. 10 is a graph showing height-direction distribution cut along an arbitrary axis (for example, the X-axis) passing through the center of the substrate for a mold shape MH (Mold Height) and a height WT (Wafer Topography) of each position of the substrate when the mold 18 is brought into contact with the substrate 1. The timing for making the mesa and the imprint material arranged on the substrate contact each other can be calculated from the distance between MH and WT and information of approaching speed between them. Since the distance between them is small at a position X1, the contact between the mesa and the imprint material on the substrate starts at an early timing. Since the distance between them is large at a position X2, the contact between the mesa and the imprint material on the substrate starts at a later timing.

The pieces of information of the mold shape MH and the substrate height WT may be obtained by measuring the height in the apparatus, from the external measurement result, or design information without performing actual measurement. The substrate height WT tends to conform to the shape of a substrate chuck (not shown). In this case, a method of replacing the substrate height WT with concave/convex information of the substrate chuck may be used.

In imprint processing using the height information of the entire surface of the substrate and a large mold which covers the plurality of shot regions, such information must be separately managed as data of all regions unlike the concave/convex portion for each shot. The mold height information at coordinates of the entire surface of the mold is managed by, for example, the following form. Note that n and m are indices indicating the positions (coordinates) of the plurality of locations in the pattern region of the mold.

$$MHnm=(Xn,Ym,Hnm)$$

Figure 11:
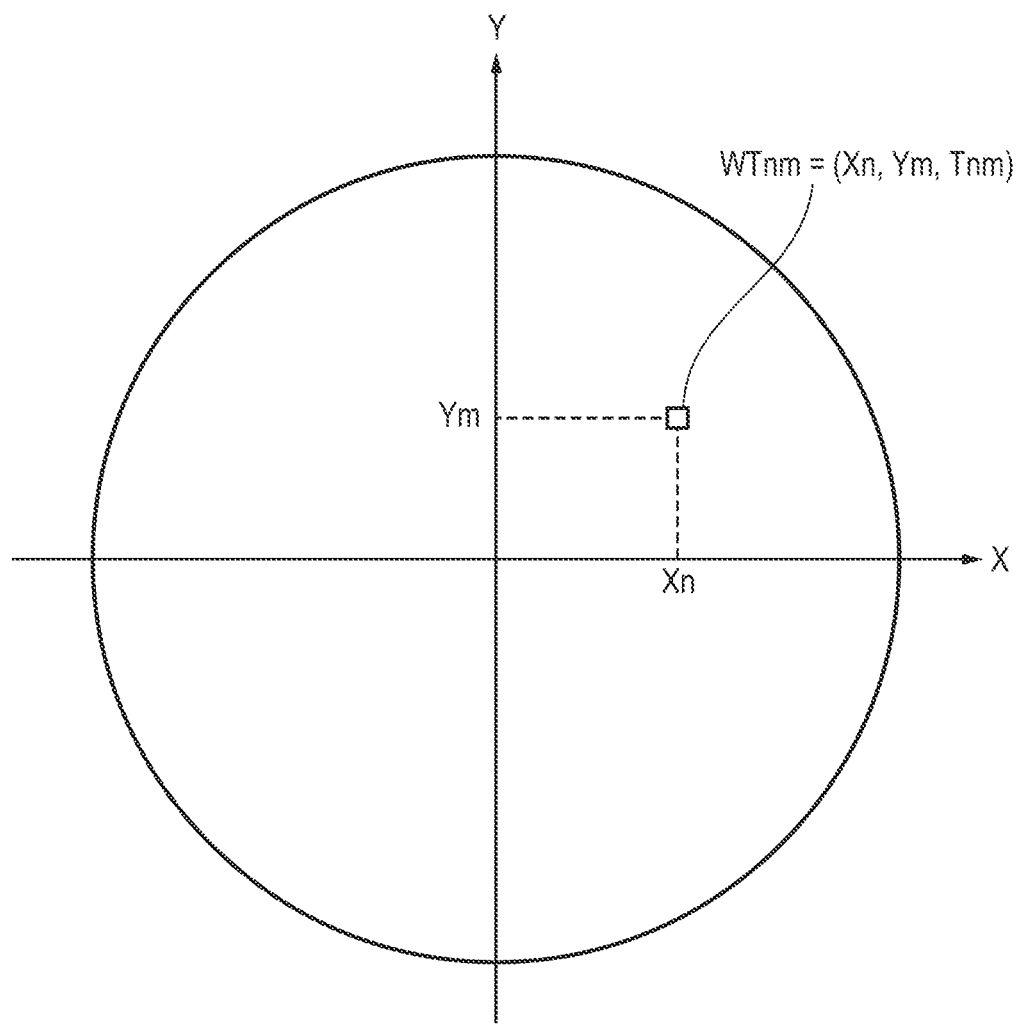
FIG. 11 is a view for explaining a height expression form at each position on the entire surface of the substrate.

As shown in FIG. 11, the height WT at each position on the entire surface of the substrate is managed by the following form:

$$WTnm=(Xn,Ym,Tnm)$$

A distance DIST between the substrate and the mold at each position is obtained by the following equation by converting the respective values into the corresponding height coordinate axis:

$$DISTnm=MHnm-WTnm \quad (1)$$

A correction coefficient VolCoef associated with the droplet arrangement can be obtained by:

$$VolCoefnm=K1(DistM-DISTnm) \quad (2)$$

where
Xn: the X-axis position coordinates of the substrate and the mold
Ym: the Y-axis position coordinates of the substrate and the mold
Hnm: the mold height at the coordinates (Xn, Ym)
Tnm: the substrate height at the coordinates (Xn, Ym)
K1: the correction constant
DistM: logical interval distance The intervals of Xn and Ym are normally several millimeters and are managed as the design data or data obtained by performing measurement on the entire surface of the substrate. The concave/convex information for each shot is managed as the design data or data obtained by measuring an interval of several μm to several tens of μm. The correction constant K1 is determined in advance by the type of imprint material, an approaching speed when the substrate is brought into contact with the mold, and the like. The logical interval distance DistM is, for example, an average interval distance between the mold and the substrate.

Figure 12A:
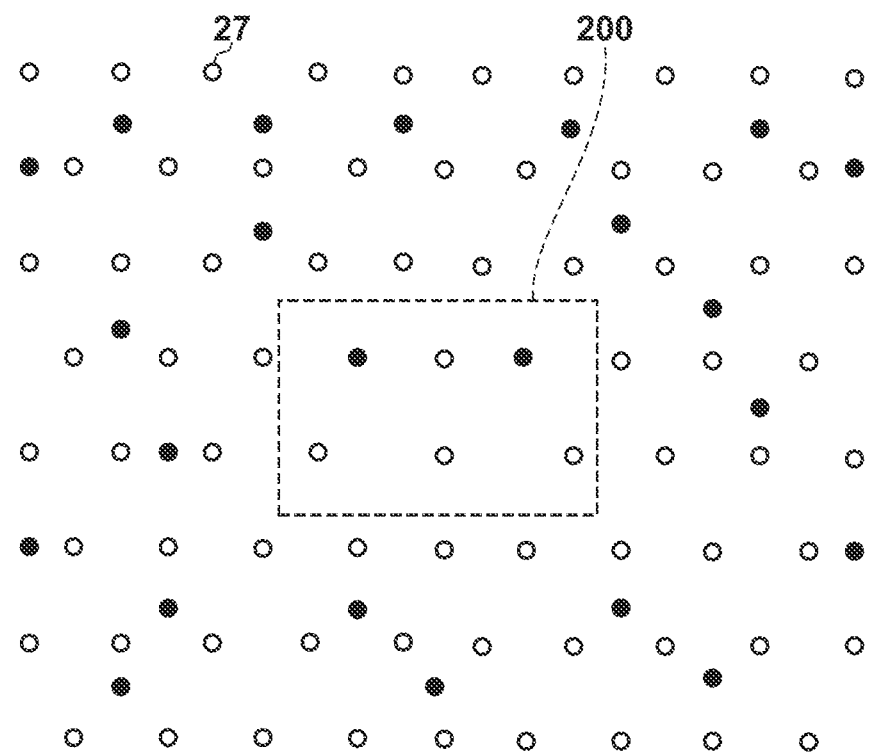
FIGS. 12A and 12B are views showing an example of correction of an arranged liquid droplet amount.
Figure 12B:
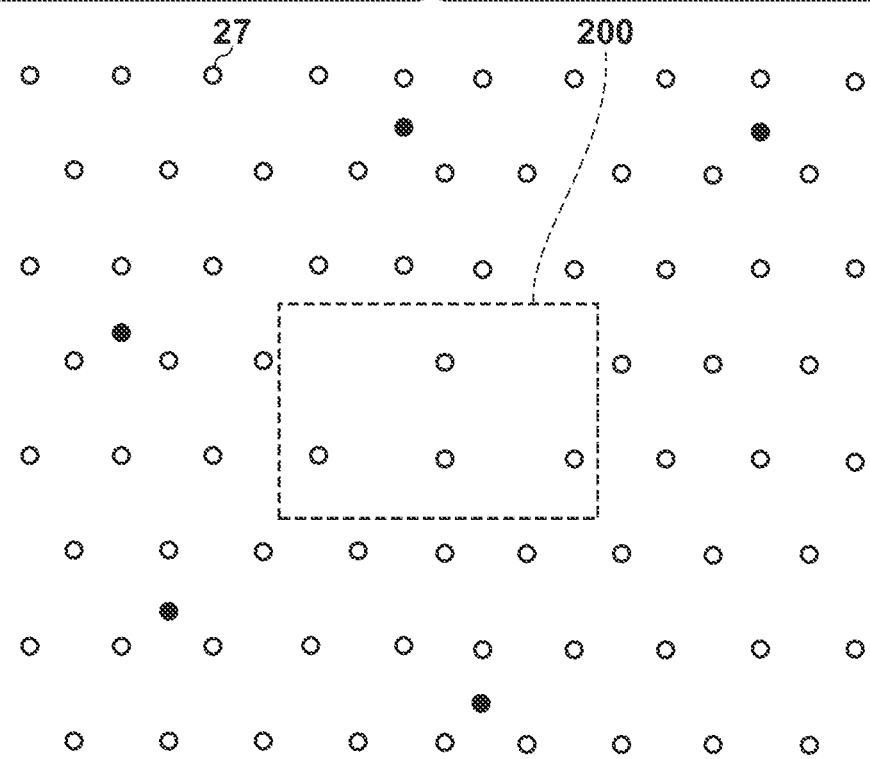

Using the correction coefficient calculated by equation (2), the drop pattern generator 407 adjusts the drop pattern arrangement determined in consideration of the small region in the shot. If DISTnm is larger than DistM, the contact timing is delayed, so that the correction coefficient VolCoefnm becomes a negative value. That is, correction is performed such that the supply amount is reduced with respect to the standard supply amount. If DISTnm is smaller than DistM, the contact timing is early, so that the correction coefficient VolCoefnm becomes a positive value. That is, correction is performed such that the supply amount is increased with respect to the standard supply amount. FIG. 12A shows an example of correction of the arranged liquid droplet amount (supply amount) when VolCoefnm in the specific region of the substrate becomes a positive value. In this case, the droplets of the specific region are arranged in a large amount to be almost uniform by FIG. 9B. FIG. 12B shows an example of correction of the arranged liquid droplet amount when VolCoefnm in the specific region of the substrate becomes a negative value. In this case, the droplets in the specific region are arranged in a small amount to be almost uniform by FIG. 9B.

Second Embodiment

The second embodiment is related to a planarized layer forming apparatus for forming a planarized layer on a substrate. The planarized layer forming apparatus forms a planarized layer on a substrate using a mold (flat template) on which no pattern is formed. The underlying pattern on the substrate has a concave/convex profile derived from a pattern formed in the previous step. More particularly, a process substrate may have a step of about 100 nm along with a multilayer structure of a recent memory element. The step derived from the moderate undulation of the entire surface can be corrected by the focus tracking function of a scan exposure apparatus used in the photo process. However, the fine concave/convex portions having a small pitch and falling within the exposure slit area of the exposure apparatus directly consume the DOF (Depth Of Focus) of the exposure apparatus. As a conventional method of planarizing the underlying pattern of the substrate, a method for forming a planarized layer, such as SOC (Spin On Carbon) or CMP (Chemical Mechanical Polishing) is used. However, the conventional technique undesirably cannot obtain sufficient planarization performance, and the concave/convex difference of the underlayer by multilayer formation tends to increase.

To solve this problem, the planarized layer forming apparatus according to this embodiment presses the flat template (flatness plate) against an uncured curable composition (for example, a resist) applied in advance to the substrate to perform local planarization within the substrate surface.

Figure 13:
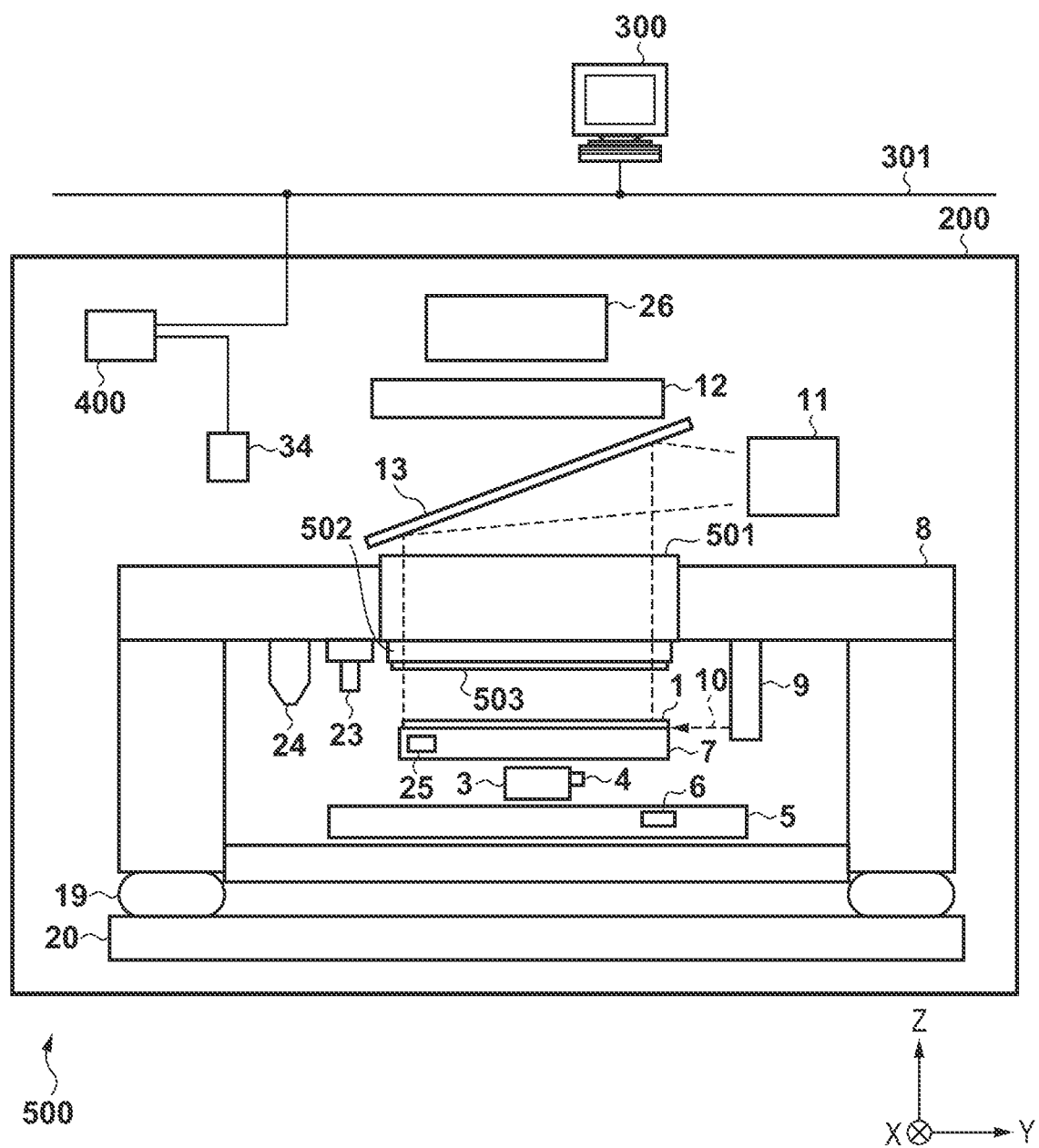
FIG. 13 is a schematic view showing the arrangement of a planarized layer forming apparatus according to an embodiment.

FIG. 13 is a schematic view showing the arrangement of a planarized layer forming apparatus 500 according to this embodiment. The arrangement of the planarized layer forming apparatus 500 is almost the same as the imprint apparatus 100 shown in FIG. 1. The same reference numerals denote the same parts in FIG. 1, and a detailed description will be omitted. The planarized layer forming apparatus 500 brings a planarizing plate 503 having an area equal to or larger than a substrate 1 into contact with the entire surface of a resist layer on the substrate 1. A plate head 501 includes a plate chuck 502 which holds the planarizing plate 503. The plate head 501 includes a mechanism capable of moving in at least three axis directions, that is, a Z-axis direction, a ωX direction, and a ωY direction with reference to a bridge structure 8 as in the mold head 16 in the imprint apparatus 100 shown in FIG. 1. The plate head 501 is coupled to the bridge structure 8 via a connecting member (not shown) and supported by the bridge structure 8. The curing light source 11 and the half mirror 13 are designed so as to irradiate the entire surface of the substrate 1 via the planarizing plate 503.

Figure 14A:
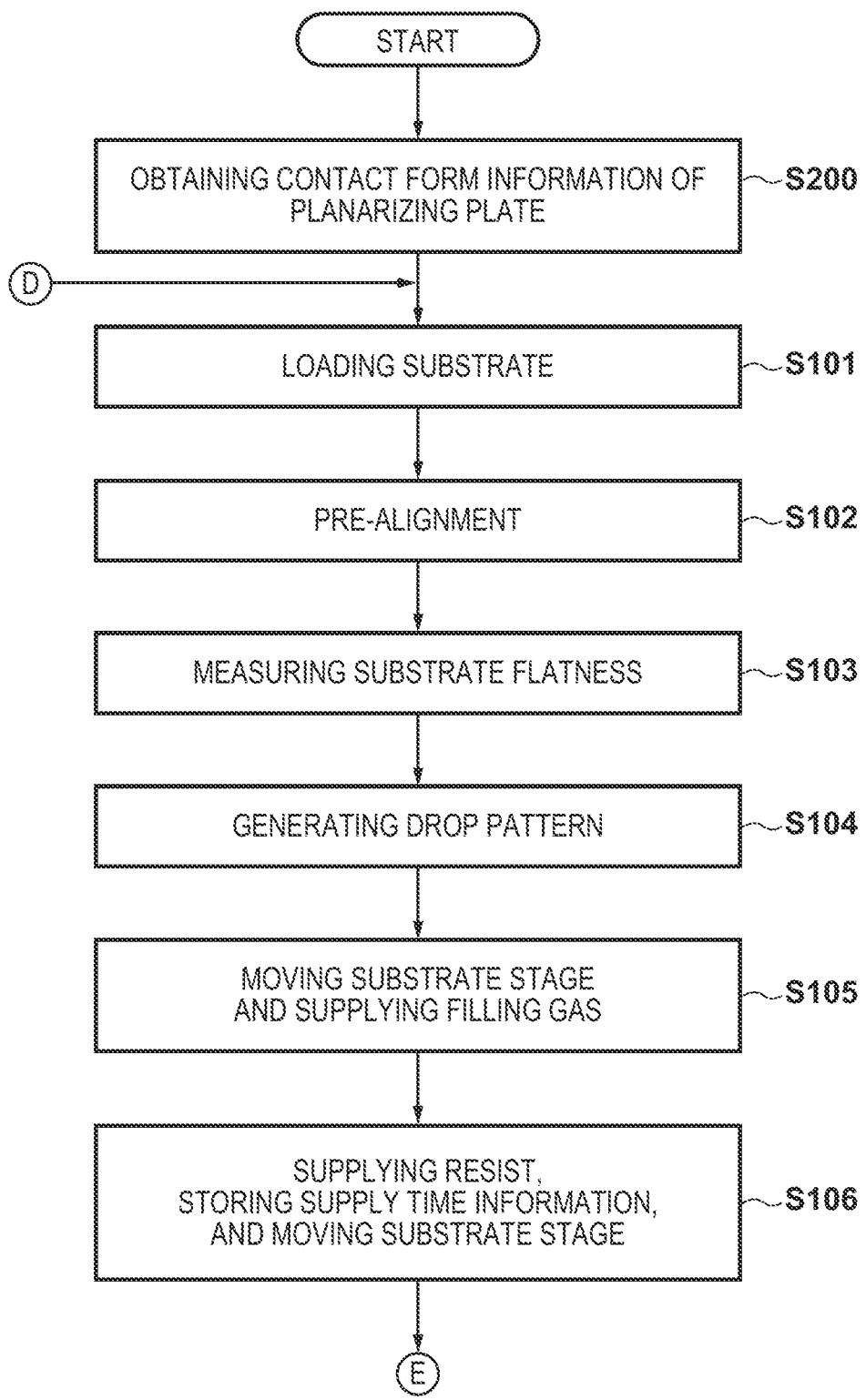
FIGS. 14A and 14B are flowcharts for explaining an operation of the planarized layer forming apparatus.
Figure 14B:
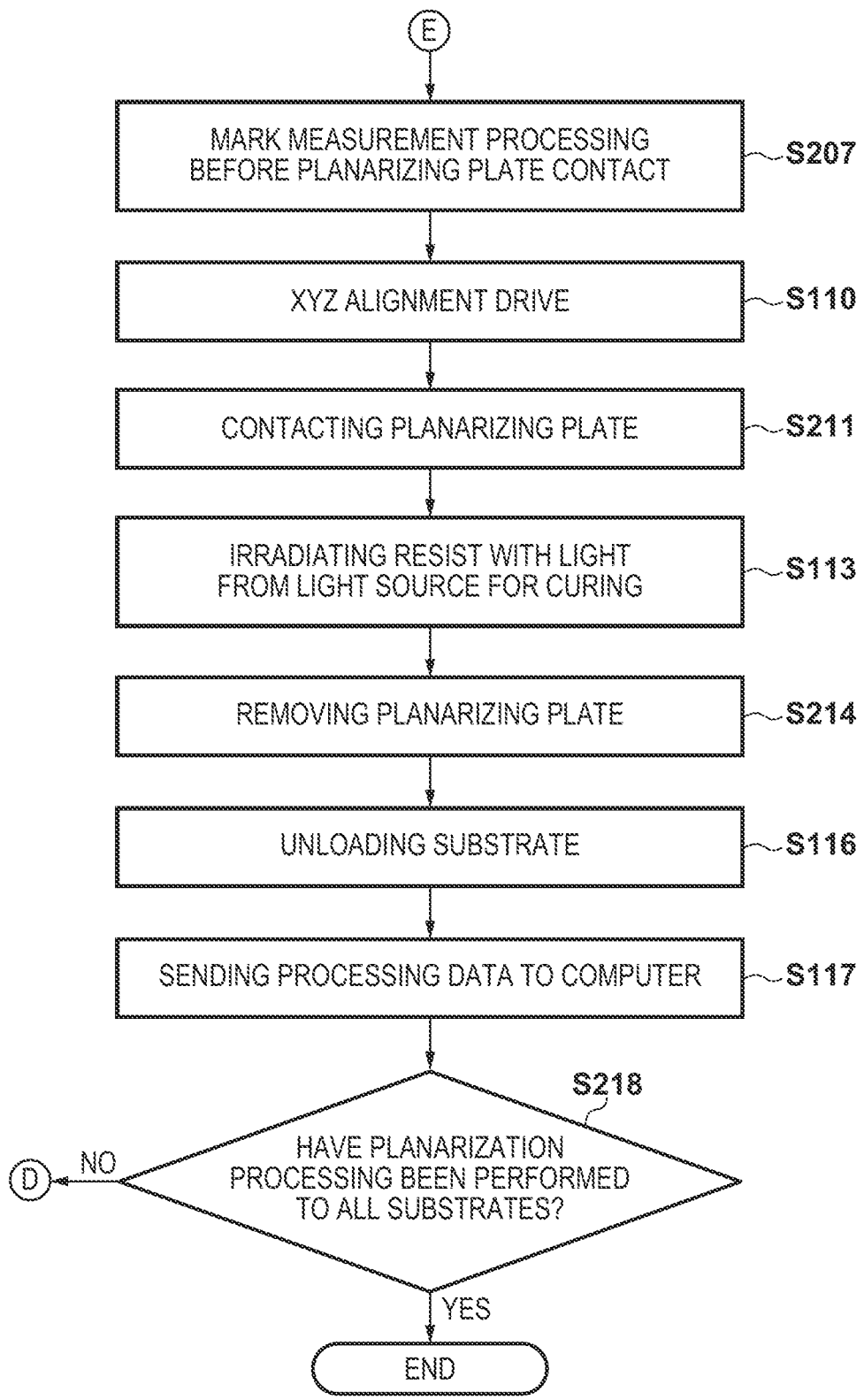

FIGS. 14A and 14B are flowcharts for explaining an operation of the planarized layer forming apparatus 500. The same reference symbols denote the same processing steps as in the processing process in the flowcharts of FIGS. 8A and 8B, and a description will be omitted. In step S200, shape information obtained when the planarizing plate 503 contacts the resist serving as the planarized layer is obtained from an external computer (not shown) or a user interface 34. In step S207, in order to align the position of the planarizing plate 503 with the substrate 1, position measurement of a mark formed on the planarizing plate 503 is performed. In step S214, when the plate head 501 is moved upward, the planarizing plate 503 is removed from the cured resist on the substrate 1. Accordingly, the planarized layer is left on the surface of the substrate 1.

A controller 400 determines in step S218 whether planarizing processing is performed on all the substrates 1. If the planarizing processing is not performed on all the substrates 1, the process advances to step S101 to perform the planarizing processing for the next substrate 1. If planarizing processing is performed for all the substrates 1, processing ends.

FIGS. 15A to 15D are views for explaining processing by a conventional planarized layer forming apparatus. FIG. 15A shows the substrate 1 before the processing. A hatched portion represents a pattern formed on the substrate 1. FIG. 15B is a view showing a state after the resist is supplied onto the substrate, but before the planarizing plate is brought into contact with the resist. This resist supply pattern is calculated under an assumption that there is no concave/convex portion on the entire surface of the substrate. FIG. 15C shows a state in which the planarizing plate perfectly contacts the resist on the substrate. FIG. 15D shows a state in which the planarizing plate is removed from the resist after the resist is irradiated with light and cured.

An actual substrate has not only a step of the pattern but also a concave/convex portion on the entire surface of the substrate. A timing at which the planarizing plate is brought into contact with resist varies due to the influence of the concave/convex portion. At the first position where the planarizing plate contacts the resist, the resist moves immediately after the contact, and the thickness of the resist is made smaller than the supposed thickness (L11 in FIG. 15D). At the last position where the planarizing plate contacts the resist, the start of resist movement is delayed, and the resist flowing from the peripheral portion is added to the resist, so that the thickness of the resist in this region is made larger than the supposed thickness (L12 in FIG. 15D).

Figure 16A:
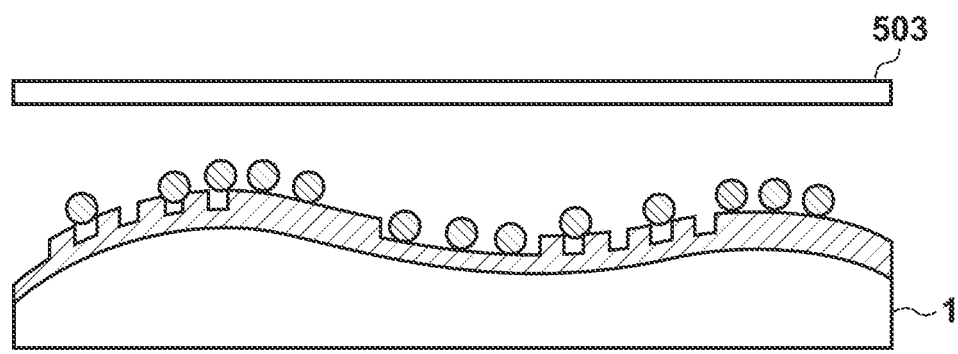
FIGS. 16A to 16C are views for explaining processing by the planarized layer forming apparatus according to an embodiment.
Figure 16B:
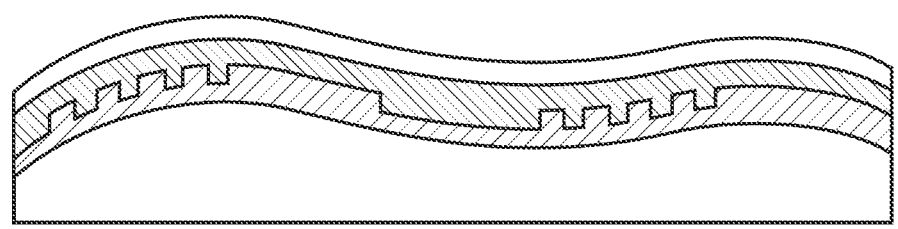
Figure 16C:
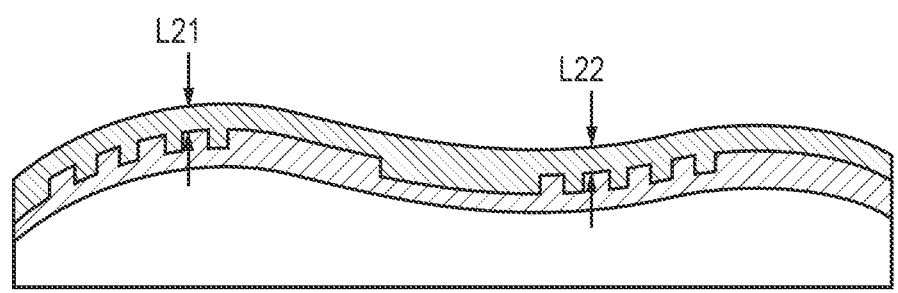

FIGS. 16A to 16C are views for explaining the processing by the planarized layer forming apparatus 500 according to this embodiment. FIG. 16A is a view showing a state after the resist is supplied onto the substrate, but before the planarizing plate 503 is brought into contact with the resist as in FIG. 15B. This resist supply pattern is calculated in consideration of the concave/convex information on the entire surface of the substrate. FIG. 16B shows a state in which the planarizing plate 503 perfectly contacts the resist on the substrate. FIG. 16C shows a state in which the planarizing plate 503 is removed from the resist after the resist is irradiated with light and cured.

As described above, an actual substrate has not only a step of the pattern but also a concave/convex portion on the entire surface of the substrate. A timing at which the planarizing plate 503 is brought into contact with resist varies due to the influence of the concave/convex portion. According to this embodiment, at the first position where the planarizing plate contacts the resist, the resist moves immediately after the contact, but a large amount of resist is arranged in accordance with the degree of resist movement. At the last position where the planarizing plate contacts the resist, the start of resist movement is delayed, and the resist flowing from the peripheral portion is added to the resist, so that the amount of resist is decreased in accordance with the degree of resist movement. According to this measure, a planarized layer having a uniform thickness on the entire surface of the substrate can be formed.

Third Embodiment

Figure 17:
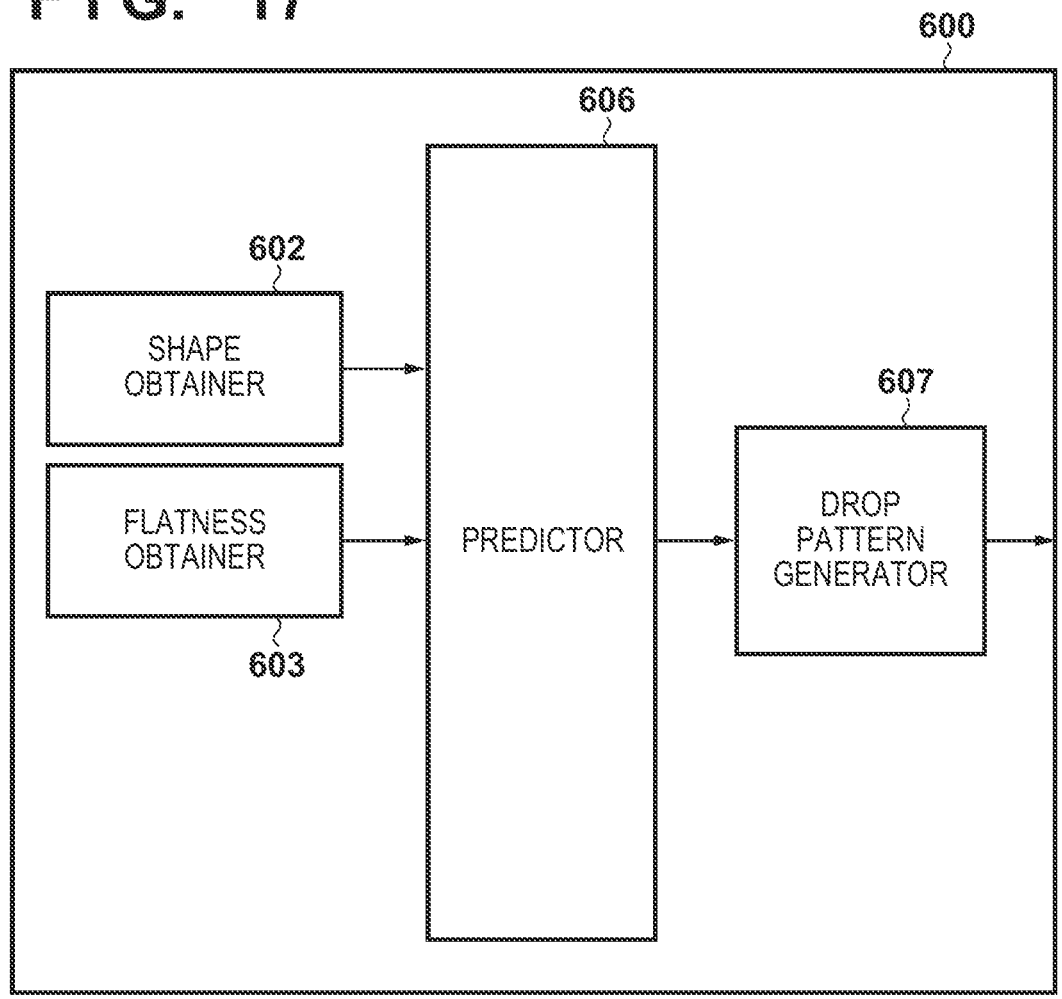
FIG. 17 is a block diagram showing the functional arrangement of a resist supply pattern generator.

FIG. 17 is a block diagram showing the functional arrangement of a resist supply pattern generating apparatus 600. A shape obtainer 602 obtains shape information when a planarizing plate 503 is brought into contact with a resist. Although the planarizing plate 503 is designed to be flat, in some cases, a positive pressure is applied to the held planarizing plate 503 from above to deform the planarizing plate 503, thereby bringing the planarizing plate 503 into contact with the resist. The shape obtainer 602 obtains the shape information in this state. A flatness obtainer 603 obtains the flatness information of the substrate. This flatness information may be obtained from a measurement result by an external measurement device or obtained from the result of height measurement on the entire surface of the substrate by an off-axis scope 24. Alternatively, the flatness information may be designed flatness information of the substrate. From the shape information obtained by the shape obtainer 602 and the flatness information obtained by the flatness obtainer 603, a predictor 606 calculates a timing at which the planarizing plate 503 is brought into contact with the resist in each region of the substrate. A drop pattern generator 607 generates a resist supply pattern based on the timing information calculated by the predictor 606. If the apparatus using the resist supply pattern can change the discharge liquid droplet amount depending on a coating region, the resist supply pattern can be output as information for changing the discharge amount per one droplet.

It is assumed that the concave/convex amount of a shape when the planarizing plate 503 is brought into contact with the resist is as small as negligible with respect to the concave/convex amount obtained by the flatness obtainer 603. In this case, the predictor 606 may set, as a contact timing predicted value, a value of only the flatness information obtained by the flatness obtainer 603.

Fourth Embodiment

Figure 18:
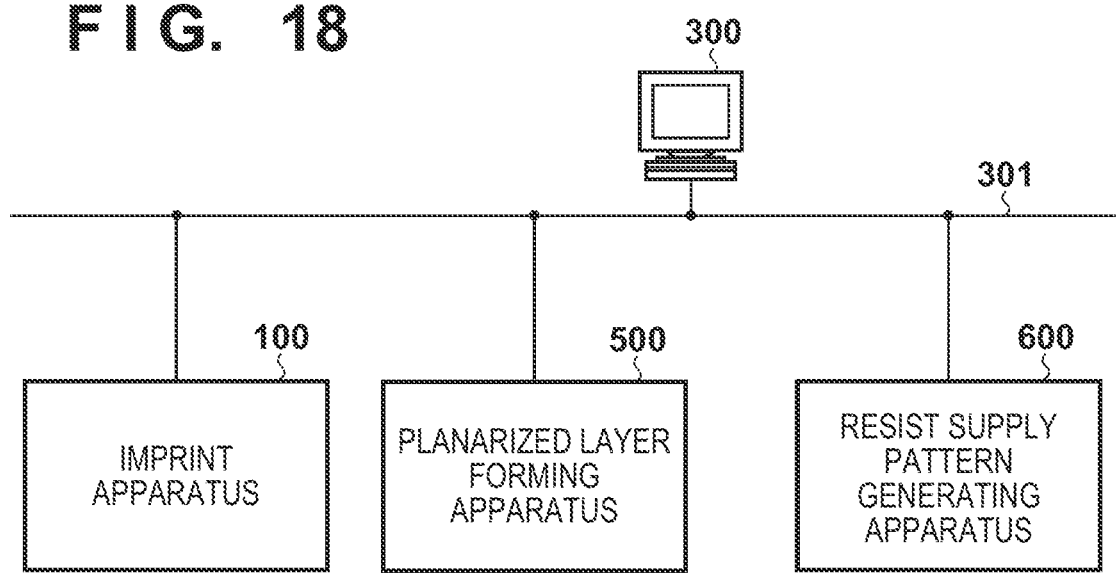
FIG. 18 is a block diagram showing the arrangement example of a pattern forming system.

FIG. 18 is a block diagram showing the arrangement example of a pattern forming system. The system includes an imprint apparatus 100, a planarized layer forming apparatus 500, and a resist supply pattern generating apparatus 600, all of which are connected to a supervising computer 300 via a network 301. The supervising computer 300 sends, to the planarized layer forming apparatus 500, data of the resist supply pattern generated by the resist supply pattern generating apparatus 600. The planarized layer forming apparatus 500 forms a planarized layer on a substrate using the received resist supply pattern data. The substrate on which this planarized layer is formed is conveyed to the imprint apparatus 100 by a conveying device (not shown). The imprint apparatus 100 performs imprint processing on the planarized layer of the conveyed substrate.

<Embodiment of Method of Manufacturing Article>

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

A detailed method of manufacturing an article will be described next. In step SA of FIG. 19, a substrate 1z such as a silicon substrate with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 19:
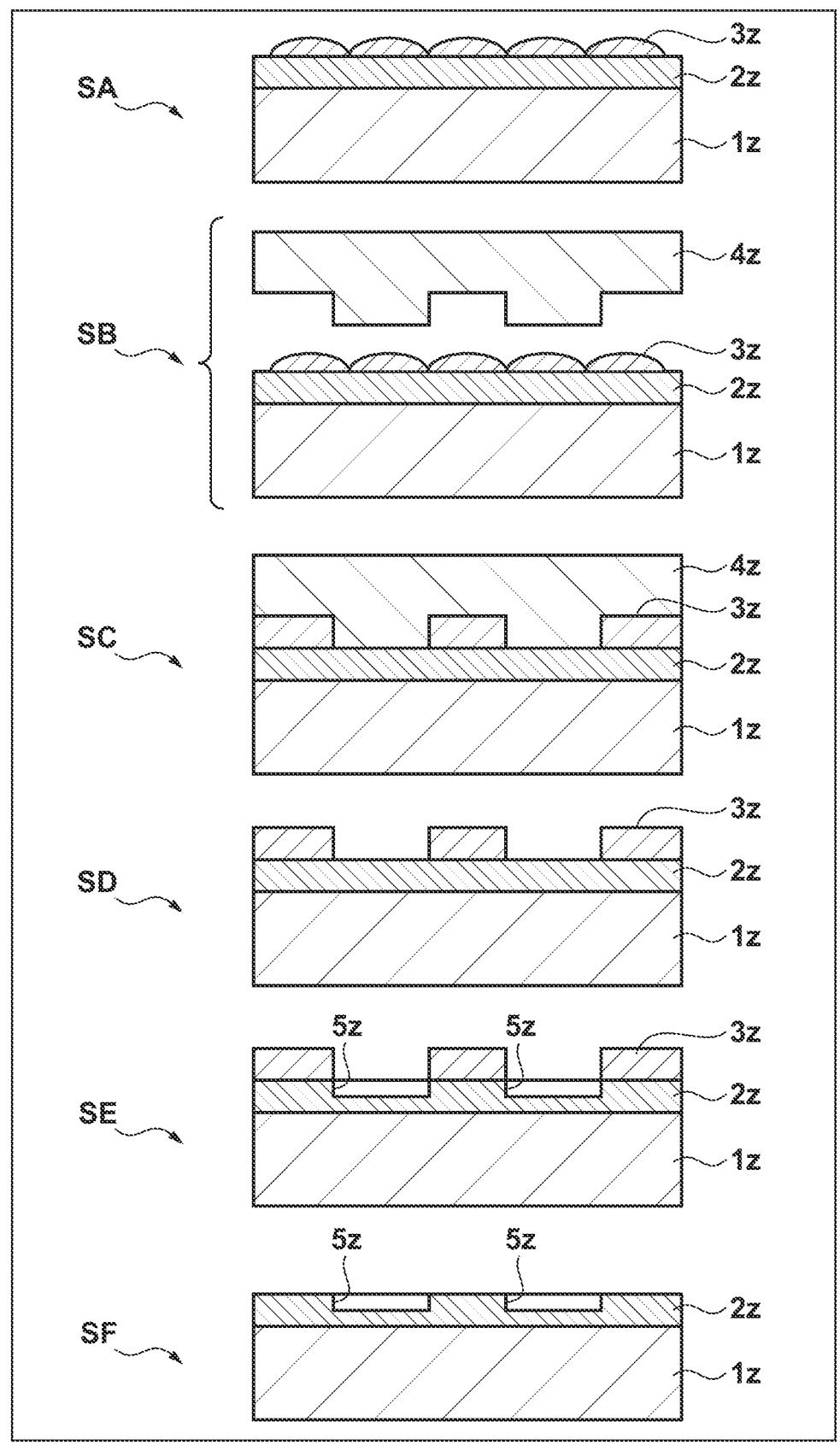
FIG. 19 is a view for explaining a method of manufacturing an article according to an embodiment.

In step SB of FIG. 19, a side of a mold 4z for imprint with an uneven pattern is directed to and caused to face the imprint material 3z on the substrate. In step SC of FIG. 19, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing via the mold 4z, the imprint material 3z is cured.

In step SD of FIG. 19, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

In step SE of FIG. 19, when etching is performed using the pattern of the cured product as an etching resistant mask, a portion of the surface of the processed material 2z where the cured product does not exist or remains thin is removed to form a groove 5z. In step SF of FIG. 19, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-027251, filed Feb. 19, 2018 and No. 2019-006213, filed Jan. 17, 2019, which are hereby incorporated by reference herein in their entirety.

What is claimed is:

1. An imprint apparatus for bringing a mold and an imprint material on a substrate into contact with each other and performing imprint processing for forming a pattern of the imprint material, comprising:
   a supplier configured to supply the imprint material on the substrate in accordance with a supply pattern of the imprint material; and
   a controller configured to control the supplier,
   wherein the controller is programmed to:
      obtain substrate shape information from a shape obtainer,
      obtain substrate flatness information from a flatness obtainer,
      predict, based on the obtained substrate shape information and the obtained mold shape information, a contact timing as a timing at which the mold and the imprint material are brought into contact with each other at each of a plurality of positions of the mold,
      control, based on the predicted contact timing, the supplier to supply the supply pattern of the imprint material at each of the plurality of positions of the mold.

2. The apparatus according to claim 1, wherein the imprint processing is collectively performed for a plurality of shot regions of the substrate.

3. The apparatus according to claim 1, wherein the substrate flatness information is flatness information of an underlayer formed on the substrate.

4. The apparatus according to claim 1, wherein the controller determines the supply pattern such that at a position of the plurality of positions where the predicted contact timing is early, a supply amount of the imprint material increases with respect to a standard supply amount of the imprint material when the substrate is flat, and at a position where the predicted contact timing is later, the supply amount of the imprint material decreases with respect to the standard supply amount.

5. The apparatus according to claim 1, wherein the controller predicts the contact timing further based on at least one of pattern design information of the mold, a specified residual layer thickness of a pattern to be formed on the substrate, and type information of the supplier.

6. The apparatus according to claim 1, further comprising a height measurement device configured to perform height measurement of an entire surface of the substrate, wherein the controller obtains the substrate flatness information using a measurement result of the height measurement device.

7. A planarized layer forming apparatus for bringing a curable composition on a substrate and a planarizing plate into contact with each other and forming a planarized layer by the curable composition, comprising:
   a supplier configured to supply the curable composition on the substrate in accordance with a supply pattern of the curable composition; and
   a controller configured to control the supplier,
   wherein the controller is programmed to:
      obtain substrate shape information from a shape obtainer,
      obtain substrate flatness information from a flatness obtainer,
      predict, based on the obtained planarizing plate shape information and the obtained substrate flatness information, a contact timing as a timing at which the curable composition and the planarizing plate are brought into contact with each other at each of a plurality of positions of the planarizing plate, and
      control, based on the predicted contact timing, the supplier to supply the supply pattern of the curable composition at each of the plurality of positions of the mold.

8. A forming apparatus for bringing a curable composition on a substrate and a mold into contact with each other and forming a cured product by the curable composition, comprising:
   a supplier configured to supply the curable composition on the substrate in accordance with a supply pattern of the curable composition; and
   a controller configured to control the supplier,
   wherein the controller is programmed to:
      obtain substrate shape information from a shape obtainer,
      obtain substrate flatness information from a flatness obtainer,
      predict, based on the obtained mold shape information and the obtained substrate flatness information, a contact timing as a timing at which the curable composition and the mold are brought into contact with each other at each of a plurality of positions of the mold, and
      control, based on the predicted contact timing, the supplier to supply the supply pattern of the curable composition at each of the plurality of positions of the mold.

9. A control method of an imprint apparatus that includes a supplier configured to supply an imprint material onto a substrate in accordance with a supply pattern of the imprint material and forms a pattern of the imprint material by bringing a mold and the imprint material supplied onto the substrate into contact each other, comprising:
   obtaining substrate shape information from a shape obtainer,
   obtaining substrate flatness information from a flatness obtainer,
   predicting, based on the obtained mold shape information and the obtained substrate flatness information, a contact timing as a timing at which the mold and the imprint material are brought into contact with each other at each of a plurality of positions of the mold, and controlling, based on the predicted contact timing, the supplier to supply the supply pattern of the imprint material at each of the plurality of positions of the mold.

10. A control method of a forming apparatus that includes a supplier configured to supply a curable composition onto a substrate in accordance with a supply pattern of the curable composition and forms a pattern of the curable composition by bringing the mold and the curable composition supplied onto the substrate into contact each other, comprising:

obtaining substrate shape information from a shape obtainer, obtaining substrate flatness information from a flatness obtainer, predicting, based on the obtained mold shape information and the obtained substrate flatness information, a contact timing as a timing at which the curable composition and the mold are brought into contact with each other at each of a plurality of positions of the mold, and controlling, based on the predicted contact timing, the supplier to supply the supply pattern of the curable composition at each of the plurality of positions of the mold.

11. A method of manufacturing an article, comprising:

forming a pattern on a substrate using an imprint apparatus for bringing a mold and an imprint material on the substrate into contact with each other and performing imprint processing for forming a pattern of the imprint material; and processing the substrate on which the pattern has been formed in the forming, wherein the article is manufactured from the substrate processed in the processing, wherein the imprint apparatus comprises:

a supplier configured to supply the imprint material on the substrate in accordance with a supply pattern of the imprint material, and a controller configured to control the supplier, wherein the controller is programmed to:

obtain substrate shape information from a shape obtainer, obtain substrate flatness information form a flatness obtainer, predict, based on the obtained mold shape information and the obtained substrate flatness information, a contact timing as a timing at which the mold and the imprint material are brought into contact with each other at each of a plurality of positions of the mold, and control, based on the predicted contact timing, the supplier to supply the supply pattern of the imprint material at each of the plurality of positions of the mold.

12. A method of manufacturing an article, comprising:

forming a planarized layer on a substrate using a planarized layer forming apparatus for bringing a curable composition on the substrate and a planarizing plate into contact with each other and forming a planarized layer by the curable composition; and processing the substrate on which the pattern has been formed in the forming, wherein the article is manufactured from the substrate processed in the processing, wherein the planarized layer forming apparatus comprises:

a supplier configured to supply the curable composition on the substrate in accordance with a supply pattern of the curable composition; and a controller configured to control the supplier, wherein the controller is programmed to:

obtain substrate shape information from a shape obtainer, obtain substrate flatness information from a flatness obtainer, predict, based on the obtained planarizing plate shape information and the obtained substrate flatness information, a contact timing as a timing at which the curable composition and the planarizing plate are brought into contact with each other at each of a plurality of positions of the planarizing plate, and control, based on the predicted contact timing, the supplier to supply the supply pattern of the curable composition at each of the plurality of positions of the mold.

13. A method of manufacturing an article, comprising:

forming a cured product of the curable composition on a substrate using a forming apparatus for bringing a curable composition on the substrate and a mold into contact with each other and forming a cured product by the curable composition; and processing the substrate on which the cured product has been formed in the forming, wherein the article is manufactured from the substrate processed in the processing, wherein the forming apparatus comprises:

a supplier configured to supply the curable composition on the substrate in accordance with a supply pattern of the curable composition; and a controller configured to control the supplier, wherein the controller is programmed to:

obtain substrate shape information from a shape obtainer, obtain substrate flatness information from a flatness obtainer, predict, based on the obtained mold shape information and the obtained substrate flatness information, a contact timing as a timing at which the curable composition and the mold are brought into contact with each other at each of a plurality of positions of the mold, and control, based on the predicted contact timing, the supplier to supply the supply pattern of the curable composition at each of the plurality of positions of the mold.

* * * * *